(12) United States Patent
Zhao

(10) Patent No.: US 6,198,170 B1
(45) Date of Patent: Mar. 6, 2001

(54) BONDING PAD AND SUPPORT STRUCTURE AND METHOD FOR THEIR FABRICATION

(75) Inventor: Bin Zhao, Irvine, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/465,532

(22) Filed: Dec. 16, 1999

(51) Int. Cl.$^7$ .......................... H01L 23/48; H01L 23/52; H01L 25/40

(52) U.S. Cl. .......................... 257/784; 257/786; 257/781; 438/612

(58) Field of Search ...................................... 257/781, 782, 257/784, 786, 774; 438/612, 614

(56) References Cited

U.S. PATENT DOCUMENTS

| | | |
|---|---|---|
| 4,811,081 | * 3/1989 | Lyden . |
| 5,001,542 | * 3/1991 | Tsukagoshi et al. . |
| 5,407,864 | * 4/1995 | Kim . |
| 5,736,791 | * 4/1998 | Fujiki et al. . |
| 5,886,409 | * 3/1999 | Ishino et al. . |
| 6,064,120 | * 5/2000 | Cobbley et al. . |
| 6,108,212 | * 8/2000 | Lach et al. . |

* cited by examiner

Primary Examiner—Sheila V. Clark
(74) Attorney, Agent, or Firm—Farjami & Farjami LLP

(57) ABSTRACT

A copper bonding pad is directly supported by a copper via pad structure, the copper via pad structure having substantially the same geometry and dimensions as the copper bonding pad. The combination of the copper bonding pad and the copper via pad structure results in an increase in effective thickness of the copper bonding pad. Due to this effective increase in the bonding pad thickness, the bonding pad is more tolerant to the potential dishing problem caused by the CMP process. Additional metal pad structures and via pad structures are used below the bonding pad. The additional metal pad structures and via pad structures comprise alternating segments of interconnect metal and dielectric fillers, and alternating segments of via metal and dielectric fillers, respectively. The alternating segments of interconnect metal and dielectric fillers and the alternating segments of via metal and dielectric fillers prevent or reduce the potential dishing problem that otherwise exists in damascene and CMP processing. The alternating segments of interconnect metal and dielectric fillers and the alternating segments of via metal and dielectric fillers are arranged such that there are a number of columns of solid metal support under the bonding pad. The columns of solid metal support significantly improve the poor mechanical support otherwise provided by the low dielectric constant materials that are presently used in fabrication of modern copper integrated circuits. The columns of solid metal support also improve thermal conductivity of the bonding pad.

32 Claims, 12 Drawing Sheets

Top View of Metal Pad Structure 422 in Figure 4

Top View of Via Pad Structure 420 in Figure 4

Top View of Metal Pad Structure 418 in Figure 4

Top View of Via Pad Structure 416 in Figure 4

Top View of Metal Pad Structure 414 in Figure 4

Top View of Via Pad Structure 412 in Figure 4

Top View of Bonding Pad 410 in Figure 4

Columns having only interconnect metal and via metal

Columns having dielectric only

Columns having interconnect metal, via metal, and dielectric

BONDING PAD AND SUPPORT STRUCTURE AND METHOD FOR THEIR FABRICATION

BACKGROUND OF THE INVENTION

1. Field of the Invention

The present invention is in the field of integrated circuit fabrication. More particularly, the invention is in the field of bonding pad and support structures for integrated circuits using copper and low dielectric constant materials.

2. Background Art

The drive to fabricate faster IC (Integrated Circuit) chips is in large part focused on improving the speed of the IC chip interconnect while maintaining or improving other aspects of IC chip performance such as, low power consumption, low noise, and long term reliability and while maintaining or improving the manufacturing cost. Interconnect delay is directly proportional to the product of interconnect resistance and the capacitance driven by the interconnect. Thus, in order to improve the speed of the IC chip interconnect, there is need to the reduce the resistivity and the capacitance of the IC chip interconnect. The capacitance of the interconnect is directly proportional to the dielectric constant ("k") of the dielectric that insulates the interconnect from other interconnect or other circuits of the IC chip. As such, reducing the dielectric constant of the dielectric results in a reduction of the interconnect capacitance and a reduction in the interconnect delay.

Traditionally, aluminum has been used as the primary interconnect conductor and silicon dioxide has been used as the primary dielectric in IC chips. Recently, copper has become more desirable as an interconnect conductor at least partly due to the fact that copper has lower resistivity than aluminum. Also recently, a number of low dielectric constant ("low-k") materials having dielectric constants below that of silicon dioxide (whose dielectric constant is approximately 4.0) have been used in IC chips. However, the use of copper and a low-k dielectric material has introduced a number of challenges in manufacturing IC chips.

For example, it is difficult to etch copper and as such the "subtractive etch" process used to etch aluminum cannot be successfully used in copper chips. Thus, the present approach to patterning copper interconnect is based on "damascene" processing. The term "damascene" is derived from the ancient in-laid metal artistry originated in Damascus. According to the damascene process, a trench or canal is cut into the dielectric and then filled with metal. FIGS. 1A through 1D help describe an overview of the damascene process used to fabricate copper interconnect.

Referring to FIG. 1A, insulating layer 102 (for example, silicon dioxide) is formed on a substrate 104, which usually contains circuitry and may contain other interconnection levels. To help with the patterning of copper by the damascene process, layer 102 should have a uniform thickness and be as flat as possible. An ideally flat insulating layer 102 is shown in FIG. 1A.

FIG. 1B shows a cross-section of layer 102 after patterning to create two trenches, wide trench 106 and narrow trench 108. These trenches are formed by removing a top portion of layer 102 using photolithography and a suitable anisotropic etch technique, such as reactive ion etching, which are known in the art. These trenches are where copper interconnect conductors should be laid in. Moreover, insulator 107 is to provide insulation between the copper interconnect to be laid in trench 106 and the copper interconnect to be laid in trench 108. Referring to FIG. 1C, copper film 112 is shown as having been deposited over insulating layer 102. Although not shown in any of the Figures, prior to deposition of copper film 112, a metal barrier layer such as tantalum (Ta) or tantalum nitride (TaN) is deposited over insulating layer 102. Copper film 112 may, for example, be formed by chemical vapor deposition (CVD), physical vapor deposition (PVD), PVD followed by reflow, or electroplating. Preferably, copper film 112 is deposited to a depth such that trenches 106 and 108 are completely filled with copper. Manifestly, the unwanted portions of copper film 112, for example the portion that is shown as covering insulator barrier 107, must be removed.

FIG. 1D shows a wide inlaid copper conductor 114 and a narrow inlaid copper interconnect 116 remaining in trenches 106 and 108, respectively, after polishing to remove the unwanted portions of copper film 112. Polishing is preferably accomplished by chemical-mechanical polishing (CMP), wherein the semiconductor wafer and/or a polishing pad are rotatably mounted and brought into contact with each other under rotation. A slurry providing both abrasive and chemically reactive components is supplied, typically to the pad, during polishing. The abrasive component is typically comprised of finely ground colloidal silica or alumina particles. The chemically reactive component is typically diluted acid and/or hydrogen peroxide, with the remainder of the slurry comprised of deionized water. In general, it is desirable that the slurry composition and polishing conditions (e.g. rotational velocity, polish force, temperature) be adjusted such that the conducting films (i.e. the deposited copper film and the metal barrier layer) are selectively removed at a faster rate than the insulating layer (30:1 being a typical ratio) during the CMP.

One drawback of the CMP process, however, is illustrated in FIG. 1D. The top surface of narrow copper interconnect 116 is shown as slightly "dished" but substantially co-planar with the upper surface of insulating layer 102. However, wide copper interconnect 114 is shown as severely dished. The dishing phenomenon, such as that shown in wide interconnect 114, results in an uneven profile in the interconnect layer which is harmful to the fabrication process of subsequent layers in the IC chip. In extreme cases, sections of a wide conductor, such as wide conductor 114, may be completely removed from the trench during polishing, leaving the trench bottom exposed. This total absence of any metal at the central parts of a wide metal conductor is undesirable since, for example, it causes an increase in the resistance of the metal interconnect and also reduces the long term reliability of the IC chip.

An additional problem caused by the dishing phenomenon is that vias that are supposed to make electrical connection between a metal layer on top of the wide conductor and the wide conductor may not reach the shallow parts of the wide conductor since the shallow parts have too little metal left and are lower than the remaining portions of the wide interconnect. In other words, while vias from an overlaying metal layer are designed to be long enough to reach the surface of an underlying metal interconnect, the vias over a wide interconnect are too short to reach the "dished" portions of the wide interconnect.

It has been discovered that the dishing during the CMP process may be substantially reduced by having "dielectric fillers" in wide trenches such as trench 106. Generally, experimentation with specific conducting and insulating materials and a desired CMP process is required to determine the minimum line width that is subject to severe dishing and as such would require dielectric fillers to reduce or eliminate such dishing. Typically this width may vary from several microns to tens of microns. However, it is generally understood that a typical bonding pad which has a width of between 60 to 100 microns is clearly wide enough to be subject to dishing as a result of the CMP process. Accordingly, dielectric fillers to reduce or eliminate dishing are conventionally needed for copper bonding pads formed by a damascene process.

Conventional solutions using dielectric fillers to reduce dishing in copper bonding pads are shown in FIGS. 2A and 2B. FIGS. 2A and 2B illustrate use of dielectric fillers with two slightly different configurations. FIG. 2A is a top view of a copper bonding pad 230. Dielectric fillers shaped as long rectangular strips (as viewed from the top of the bonding pad) are distributed within copper bonding pad 230. An example of such rectangular strip dielectric fillers is referred to by numeral 232 in FIG. 2A. FIG. 2B is a top view of a copper bonding pad 240. Dielectric fillers shaped as squares (as viewed from the top of the bonding pad) are distributed within copper bonding pad 240. An example of such square dielectric fillers is referred to by numeral 242 in FIG. 2B.

A side view of copper bonding pad 230 in FIG. 2A along the line marked as 2C (which is the same as a side view of copper bonding pad 240 in FIG. 2B along the line marked as 2C) is shown in FIG. 2C. FIG. 2C shows insulating layer 202 (corresponding to insulating layer 102 in FIGS. 1A through 1D) which rests on substrate 204 (corresponding to substrate 104 in FIGS. 1A through 1D). Trench 206 in FIG. 2C corresponds to trench 106 in FIGS. 1A through 1D while trench 208 in FIG. 2C corresponds to trench 108 in FIGS. 1A through 1D. Dielectric fillers 252 in FIG. 2C are cross-sections of dielectric fillers 232 in FIG. 2A (or dielectric fillers 242 in FIG. 2B). Dielectric fillers 252 in FIG. 2C are located between metal segments 254 in FIG. 2C. Although not apparent from FIG. 2C, metal segments 254 are electrically connected as shown in FIGS. 2A and 2B. In other words, metal segments 254 are part of the same bonding pad 230 in FIG. 2A (or bonding pad 240 in FIG. 2B).

As can be seen from FIG. 2C, narrow conductor 216 (which corresponds to narrow conductor 116 in FIG. 1D) shows only slight dishing. However, wide conductor 214 (corresponding to pad 230 in FIG. 2A or pad 240 in FIG. 2B) also shows slight dishing in metal segments 254 as shown in FIG. 2C. The reduced dishing of wide conductor 214 in FIG. 2C as compared with wide conductor 114 in FIG. 1D is due to the existence of dielectric fillers 252. Dielectric fillers 252 cause metal segments 254 to behave as narrow conductor 216 as concerns the CMP process. Accordingly, the dishing effect in metal segments 254 becomes less severe as is the case for a narrow conductor such as conductor 216.

Although the use of dielectric fillers in copper bonding pads reduces or eliminates the severe dishing problem that would otherwise exist, the dielectric fillers actually impair some of the performance characteristics of the copper bonding pads. For example, dielectric fillers lead to very poor adhesion to the bond wires which are typically made of gold or aluminum. Moreover, since some of the bonding pad is covered by dielectric fillers (which are insulators), the electrical connection between the bond wire and the bonding pad is also impaired. Further, dielectric fillers are also poor thermal conductors and as such reduce the thermal conductivity of the copper bonding pad.

Recently, some IC chip manufacturers have opted not to use dielectric fillers in copper bonding pads in order to avoid the disadvantages introduced by the dielectric fillers. These manufacturers have improved the CMP process such that the dishing problem is reduced, although not entirely eliminated. As a result of the improved CMP process, although some dishing still occurs, the dishing is not severe enough to cause a total removal of the metal from portions of a wide copper conductor.

As stated above, the need to reduce the capacitance in the IC chip interconnect has also resulted in the use of low-k dielectric materials. A low-k dielectric material is used in combination with copper interconnect (in a damascene process) to achieve a reduction in interconnect capacitance. However, low-k dielectric materials further complicate the design of copper bonding pads. Low-k dielectric materials which underlie the copper bonding pad have low mechanical strength. Due to the force applied to attach the bond wire to the bonding pad, low-k materials below the bonding pad may experience cracks. These cracks may cause immediate damage to the neighboring circuits on the IC chip. Alternatively, cracks that are too small for immediate damage may grow and cause long term reliability problems in the IC chip. Therefore, the poor mechanical strength of low-k materials must somehow be circumvented in copper chips using copper bonding pads.

From the above discussion of the background art it is apparent that there is serious need in the art for a copper bonding pad and support structure which provides sufficient mechanical support and strength, exhibits good adhesion to bond wires, maintains a very strong electrical contact with bond wires, has good thermal conductivity, and is not severely affected by the dishing problem existing in damascene and CMP processing.

SUMMARY OF THE INVENTION

The present invention is an improved bonding pad and support structure and method for their fabrication. The invention's bonding pad and support structure overcome a serious need in the art by providing sufficient mechanical support and strength for the bonding pad, good thermal conductivity, strong electrical connection with bond wires, and good adhesion to bond wires while being more tolerant to the potential dishing problem existing in damascene and CMP processing.

The invention uses a copper bonding pad directly supported by a copper via pad structure, the copper via pad structure having substantially the same geometry and dimensions as the copper bonding pad. The combination of the copper bonding pad along with the support from the copper via pad structure results in an increase in effective thickness of the bonding pad. Due to this effective increase in the bonding pad thickness, the bonding pad is more tolerant to the potential dishing problem caused by the CMP process. Because of the greater tolerance of the invention's bonding pad to the CMP process, there is no need for dielectric fillers that are otherwise used to prevent or reduce dishing. Moreover, since dielectric fillers are not used in the invention's bonding pad, the bonding pad's adhesion to bond wires, the electrical connection between the bonding pad and the bond wires, and the bonding pad thermal conductivity are all significantly improved.

Below the via pad structure directly supporting the copper bonding pad, various metal pad structures and via pad structures are used. The various metal pad structures are comprised of alternating segments of interconnect metal and dielectric fillers. Similarly, the various via pad structures are comprised of alternating segments of via metal and dielectric fillers. The alternating segments of interconnect metal and dielectric fillers and the alternating segments of via metal and dielectric fillers prevent or reduce the potential dishing problem that otherwise exists in damascene and CMP processing. The alternating segments of interconnect metal and dielectric fillers and the alternating segments of via metal and dielectric fillers are arranged such that there are a number of columns of solid metal support below the bonding pad. The columns of solid metal support significantly improve the poor mechanical support otherwise present when low dielectric constant materials are used in fabrication of conventional copper integrated circuits. The columns of solid metal support also improve thermal conductivity of the bonding pad to the substrate. Further detail, aspects, and advantages of the present invention are described in the detailed description of the invention below.

DETAILED DESCRIPTION OF THE INVENTION

The present invention is an improved bonding pad and support structure and method for their fabrication. Although the invention is described with respect to a specific embodiment, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings.

Figure 1A:
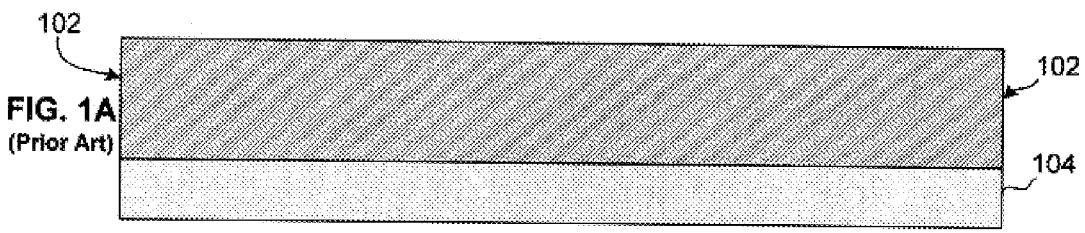
FIGS. 1A through 1D show an overview of conventional damascene and CMP processes.
Figure 1B:
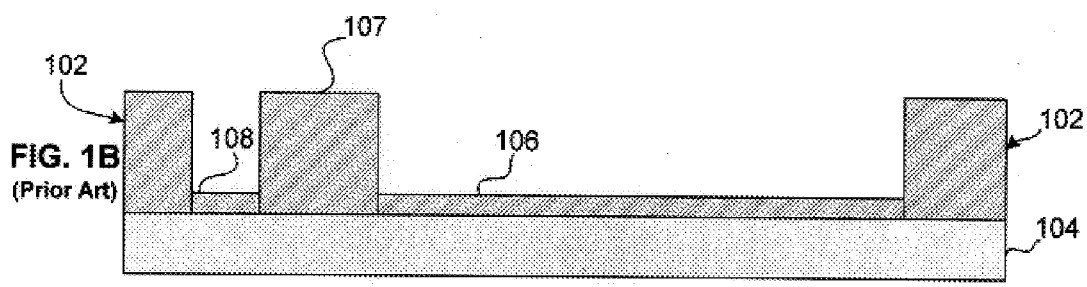
Figure 1C:
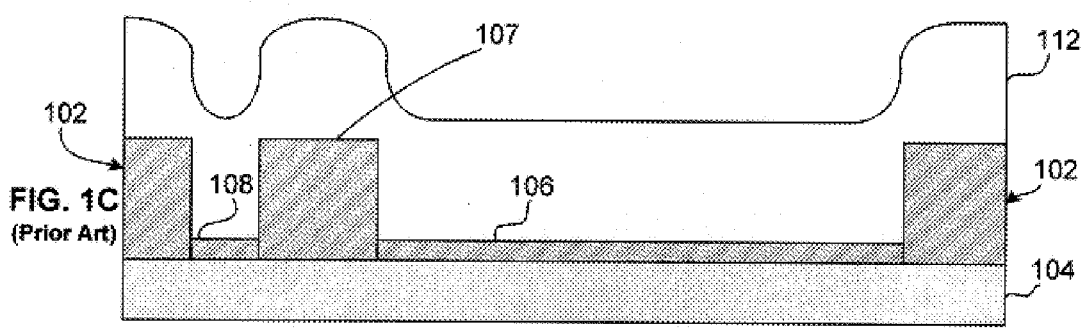
Figure 1D:
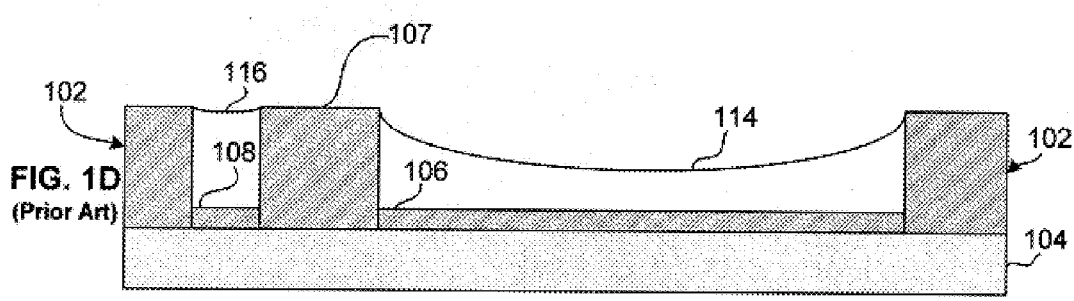
Figure 2A:
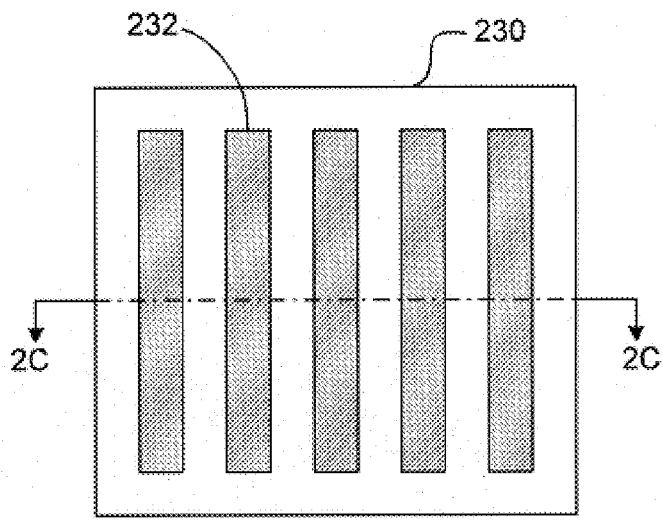
FIGS. 2A through 2C show the conventional use of dielectric fillers in order to reduce potential dishing of wide interconnect areas undergoing a CMP process.
Figure 2B:
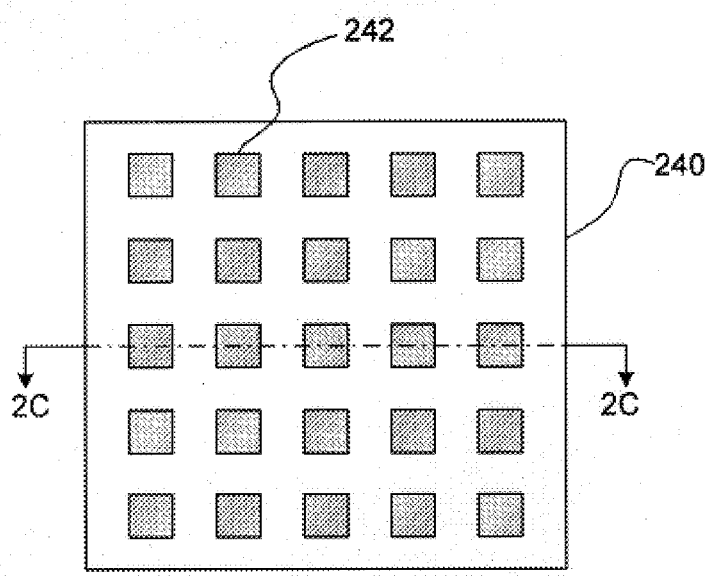
Figure 2C:
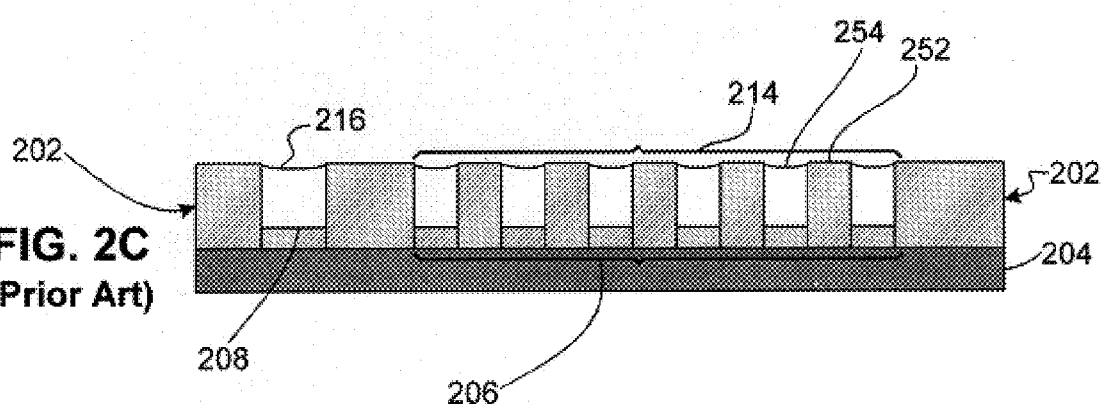
Figure 3A:
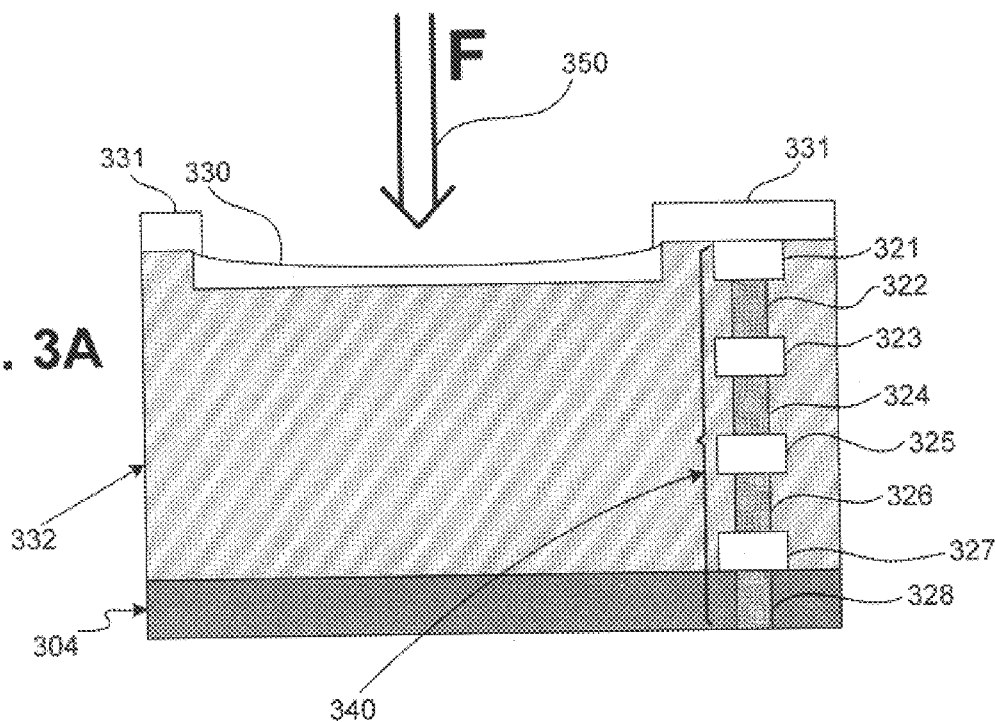
FIGS. 3A and 3B illustrate two recent copper bonding pads and their respective support structures.

Referring to FIG. 3A, a recent copper bonding pad configuration is shown. As shown in FIG. 3A, copper bonding pad 330 rests on low-k dielectric 332. Copper bonding pad 330 is the top interconnect metal layer in an exemplary four interconnect metal layer IC chip using copper as the interconnect metal in all the four interconnect metal layers. Thus, copper bonding pad 330 is patterned out of the fourth interconnect metal layer. Low-k dielectric 332 is grown or deposited on top of silicon dioxide layer 304. Silicon dioxide layer 304 is grown on top of a silicon or other semiconductor substrate. The substrate is not shown in FIG. 3A. With the exception of copper bonding pad 330 which is not covered, a passivation layer 331 covers the surface of the structure shown in FIG. 3A. The passivation layer is used to, among other things, prevent damage to the underlying semiconductor circuits and is typically a stack of silicon nitride and silicon dioxide layers.

Reference column 340 in FIG. 3A is for the purpose of illustration only and it shows four levels of metal and their respective vias stacked on top of each other. Reference column 340 is used as a guide for the purpose of illustrating the various layers of metal and vias present in the IC chip containing bonding pad 330. Reference column 340 shows top interconnect metal layer 321 which is also referred to as "M4." The top interconnect metal layer, i.e. M4, is the same layer in which bonding pad 330 is located. Directly below top interconnect metal layer 321 in reference column 340 is via 322. Via 322 is a via used for connecting top interconnect metal layer (i.e. M4) to the interconnect metal layer directly below which is the third interconnect metal layer (also referred to as "M3"). Via 322 is thus also referred to as Via (M4/M3).

The third interconnect metal layer (i.e. M3) is fabricated directly below the top interconnect metal layer. In reference column 340, interconnect metal layer three is referred to by numeral 323. Directly below the third interconnect metal layer 323 in reference column 340 is via 324. Via 324 is a via used for connecting the third interconnect metal layer (i.e. M3) to the interconnect metal layer directly below which is the second interconnect metal layer (also referred to as "M2"). Via 324 is thus also referred to as Via (M3/M2).

The second interconnect metal layer (i.e. M2) is fabricated directly below the third interconnect metal layer. In reference column 340, interconnect metal layer two is referred to by numeral 325. Directly below the second interconnect metal layer 325 in reference column 340 is via 326. Via 326 is a via used for connecting the second interconnect metal layer (i.e. M2) to the interconnect metal layer directly below which is the first interconnect metal layer (also referred to as "M1" in the present invention). Via 326 is thus also referred to as Via (M2/M1).

The first interconnect metal layer (i.e. M1) is fabricated directly below the second interconnect metal layer M2. In reference column 340, interconnect metal layer one is referred to by numeral 327. Directly below the first interconnect metal layer 327 in reference column 340 is contact 328. Contact 328 can be used for connecting the first interconnect metal layer (i.e. M1) to the layer directly below M1. The layer directly below the first interconnect metal layer (which layer is not shown in FIG. 3A) is, for example, silicon substrate, polysilicon, or an active region of silicon.

As apparent from FIG. 3A, in order to avoid the various disadvantages of dielectric fillers, no dielectric fillers have been used in copper bonding pad 330. Since no dielectric fillers have been used in copper bonding pad 330, some dishing occurs as shown in FIG. 3A. However, as stated above, due to the recent improvements in the CMP process, the dishing is not severe enough to create a hole in the central parts of bonding pad 330. Thus, it is possible to use bonding pad 330 without any dielectric fillers as shown in FIG. 3A. However, other problems existing in the structure supporting bonding pad 330 make the use of the bonding pad configuration shown in FIG. 3A unattractive. Some of these problems are discussed below.

An arrow referred to by numeral 350 in FIG. 3A symbolizes the force that is applied to bonding pad 330 during the bonding process. As stated above, low-k materials (where k designates the value of the dielectric constant) are used in copper IC chips in order to help reduce signal propagation delays in the chip. Accordingly, dielectric material 332 which supports copper bonding pad 330 has a low dielectric constant. It is well known in the art that low-k materials which are used in copper IC chips have poor mechanical strength. Thus, in reaction to force 350 applied to bonding pad 330 in FIG. 3A, cracks would develop in the low-k material 332. Some of the cracks (not shown in any of the Figures) may develop immediately and some may develop later on. In any event, the cracks cause an immediate damage to the circuits in the IC chip or cause a long term reliability problem by causing damage after some time has passed.

Moreover, low-k dielectric material 332 also exhibits poor thermal conductivity. The poor thermal conductivity results in an increase in the temperature of the semiconductor chip. It is well known in the art that an increase in the temperature of the semiconductor chip causes various problems such as an increase in propagation delays in the semiconductor material, an increase in electromigration in metal interconnect, an undesirable change in the trigger point of various logic gates, as well as other problems. Thus, although bonding pad 330 has relatively good adhesion to bond wires, bonding pad 330 does not have adequate mechanical support from low-k dielectric 332 to withstand force 350 applied during bonding of bond wires. Further, as stated above, the structure supporting bonding pad 330 in FIG. 3A has a poor thermal conductivity.

Figure 3B:
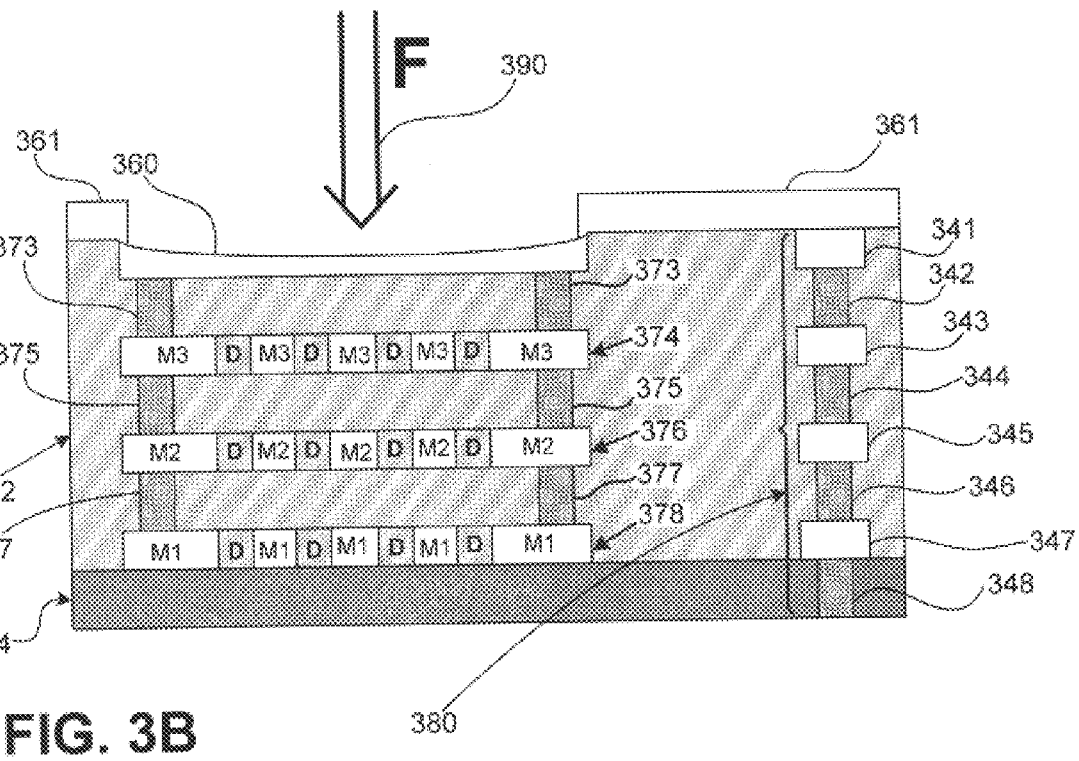

Referring to FIG. 3B, another recent copper bonding pad configuration is shown. As shown in FIG. 3B, copper bonding pad 360 rests on low-k dielectric 392. As with the bonding pad in FIG. 3A, copper bonding pad 360 is the top interconnect metal layer in an exemplary four interconnect metal layer IC chip using copper as the interconnect metal in all the four interconnect metal layers. Low-k dielectric 392 is deposited or grown on top of silicon dioxide layer 394. Silicon dioxide layer 394 is grown on top of a silicon or other semiconductor substrate. The substrate is not shown in FIG. 3B. With the exception of copper bonding pad 360 which is not covered, a passivation layer 361 covers the surface of the structure shown in FIG. 3B.

Reference column 380 in FIG. 3B is for the purpose of illustration only and it shows four levels of metal and their respective vias stacked on top of each other. Reference column 380 is used as a guide for the purpose of illustrating the various layers of metal and vias present in the IC chip containing bonding pad 360. Reference column 380 shows top interconnect metal layer 341 which is also referred to as "M4." The top interconnect metal layer, i.e. M4, is the same layer in which bonding pad 360 is located. Directly below top interconnect metal layer 341 in reference column 380 is via 342. Via 342 is a via used for connecting top interconnect metal layer (i.e. M4) to the interconnect metal layer directly below which is the third interconnect metal layer (also referred to as "M3"). Via 342 is thus also referred to as Via (M4/M3).

The third interconnect metal layer (i.e. M3) is fabricated directly below the top interconnect metal layer. In reference column 380, interconnect metal layer three is referred to by numeral 343. Directly below the third interconnect metal layer 343 in reference column 380 is via 344. Via 344 is a via used for connecting the third interconnect metal layer (i.e. M3) to the interconnect metal layer directly below which is the second interconnect metal layer (also referred to as "M2"). Via 344 is thus also referred to as Via (M3/M2).

The second interconnect metal layer (i.e. M2) is fabricated directly below the third interconnect metal layer. In reference column 380, interconnect metal layer two is referred to by numeral 345. Directly below the second interconnect metal layer 345 in reference column 380 is via 346. Via 346 is a via used for connecting the second interconnect metal layer (i.e. M2) to the interconnect metal layer directly below which is the first interconnect metal layer (also referred to as "M1" in the present invention). Via 346 is thus also referred to as Via (M2/M1).

The first interconnect metal layer (i.e. M1) is fabricated directly below the second interconnect metal layer M2. In reference column 380, interconnect metal layer one is referred to by numeral 347. Directly below the first interconnect metal layer 347 in reference column 380 is contact 348. Contact 348 can be used for connecting the first interconnect metal layer (i.e. M1) to the layer directly below M1. The layer directly below the first interconnect metal layer (which layer is not shown in FIG. 3B) is, for example, silicon substrate, polysilicon, or an active region of silicon.

As shown in FIG. 3B, immediately below the edges of bonding pad 360 are vias 373. Below vias 373 there is metal pad structure 374. Metal pad structure 374 consists of alternating segments of interconnect metal layer three (M3) and dielectric fillers. As shown in FIG. 3B, each segment of interconnect metal layer three (M3) in metal pad structure 374 is designated as "M3." Each interconnect metal segment M3 is separated by dielectric fillers designated as "D" (standing for "dielectric"). Metal pad structure 374 has the same size as bonding pad 360. However, unlike bonding pad 360, dielectric fillers are used in metal pad structure 374. It is noted that in the copper bonding pad configuration shown in FIG. 3B, vias 373 are merely 1.0 micron in width and cannot provide adequate mechanical support for bonding pad 360. Vias 373 are used around the periphery of bonding pad 360 to primarily provide primarily electrical connection, and secondarily thermal contact, between bonding pad 360 and structure 374.

Directly below the edges of metal pad structure 374 are vias 375. Below vias 375 there is metal pad structure 376. Metal pad structure 376 consists of alternating segments of interconnect metal layer two (M2) and dielectric fillers. As shown in FIG. 3B, each segment of interconnect metal layer two in metal pad structure 376 is designated as "M2." Each interconnect metal segment M2 is separated by dielectric fillers designated as "D." Metal pad structure 376 has the same size as bonding pad 360. However, unlike bonding pad 360, dielectric fillers are used in metal pad structure 376. It is noted that in the copper bonding pad configuration shown in FIG. 3B, vias 375 are merely 1.0 micron in width and cannot provide adequate mechanical support for metal pad structure 374 and bonding pad 360. Vias 375 are used around the periphery of metal pad structure 374 to primarily provide primarily electrical connection, and secondarily thermal contact, between metal pad structure 374 and structure 376.

Immediately below the edges of structure 376 are vias 377. Below vias 377 there is metal pad structure 378. Metal pad structure 378 consists of alternating segments of interconnect metal layer one (M1) and dielectric fillers. As shown in FIG. 3B, each segment of interconnect metal layer one in metal pad structure 378 is designated as "M1." Each metal segment M1 is separated by dielectric fillers designated as "D." Metal pad structure 378 has the same size as bonding pad 360. However, unlike bonding pad 360, dielectric fillers are used in metal pad structure 378. It is noted that in the copper bonding pad configuration shown in FIG. 3B, vias 377 are merely 1.0 micron in width and cannot provide adequate mechanical support for metal pad structures 376, 374, and bonding pad 360. Vias 377 are used around the periphery of metal pad structure 376 to primarily provide primarily electrical connection, and secondarily thermal contact, between metal pad structure 376 and structure 378.

As shown in FIG. 3B, metal pad structure 378 rests on silicon dioxide layer 394. Metal pad structure 378 can be electrically connected to active semiconductor circuits or devices existing below silicon dioxide layer 394 through a number of contacts. The substrate or circuits below silicon dioxide layer 394 are not shown in FIG. 3B.

As apparent from FIG. 3B, in order to avoid the various disadvantages of dielectric fillers, no dielectric fillers have been used in copper bonding pad 360. Since no dielectric fillers have been used in copper bonding pad 360, some dishing occurs as shown in FIG. 3B. However, as stated above, due to the recent improvements in the CMP process, the dishing is not severe enough to create a hole in the central parts of bonding pad 360. Thus, it is possible to use bonding pad 360 without any dielectric fillers as shown in FIG. 3B. However, other problems existing in the structure supporting bonding pad 360 make the use of the bonding pad configuration shown in FIG. 3B unattractive. Some of these problems are discussed below.

As stated above, low-k materials (where k designates the value of the dielectric constant) are used in copper IC chips in order to help reduce signal propagation delays in the chip. Accordingly, dielectric material 392 which supports copper bonding pad 360 and structures 374 and 376 has a low dielectric constant. Thus, in reaction to the force applied to bonding pad 360 during wire bonding process as symbolically shown by force 390 in FIG. 3B, cracks would develop in the low-k material 392. Some of the cracks (not shown in any of the Figures) may develop immediately and some may develop later on. In any event the cracks cause an immediate damage to the circuits in the IC chip or cause a long term reliability problem. Moreover, low-k dielectric material 392 also exhibits poor thermal conductivity. The poor thermal conductivity results in an increase in the temperature of the semiconductor chip. It is well known in the art that an increase in the temperature of the semiconductor chip causes various problems that were discussed above.

Although the bonding pad structure shown in FIG. 3B is preferable to the bonding pad structure shown in FIG. 3A, the bonding pad structure of FIG. 3B is still not satisfactory due to the fact that only a few narrow vias are used to provide mechanical support for bonding pad 360 and for structures 374 and 376. Thus, bonding pad 360 does not receive adequate mechanical support from structures 374, 376, and 378 to withstand force 390 applied during bonding of bond wires. The reason is that structures 374 and 376 are themselves inadequately supported by few narrow vias 375 and 377 and by low-k dielectric material 392. Moreover, the structures supporting bonding pad 360 in FIG. 3B, i.e. structures 374, 376, and 378 do not have high thermal conductivity since these structures must dissipate heat through low-k dielectric material 392 which in turn has poor thermal conductivity.

Figure 4:
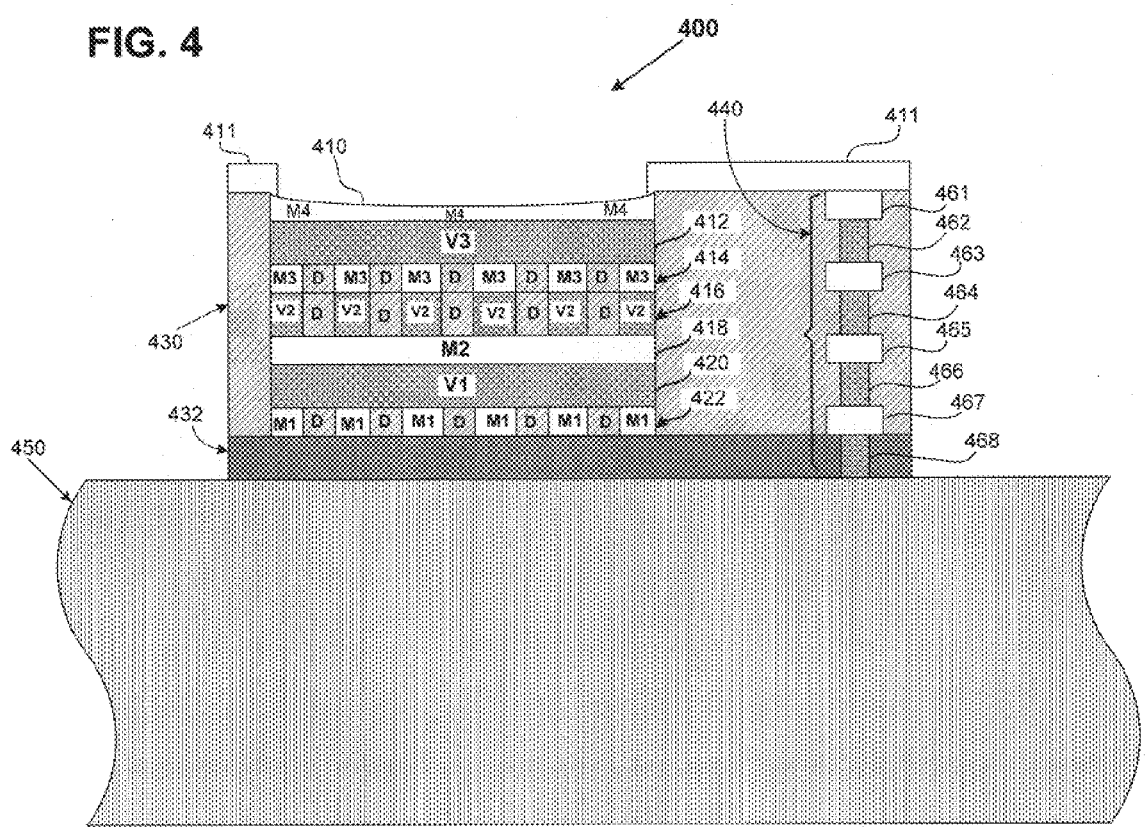
FIG. 4 illustrates the invention's copper bonding pad and support structure.

The above disadvantages in the bonding pad structures shown in FIGS. 3A and 3B are overcome by the invention's unique bonding pad and support structure 400 shown in FIG. 4. Bonding pad and support structure 400 of the present invention is also referred to as a "composite structure" in the present application. Referring to FIG. 4, substrate 450 is shown as supporting the entire bonding pad and support structure 400. Substrate 450 can be silicon or other semiconductor. Active semiconductor circuits and devices existing on substrate 450 are not shown in FIG. 4 to preserve simplicity. Grown on top of substrate 450 is a layer of insulator 432 which is typically silicon dioxide. Silicon dioxide 432 is grown or deposited on substrate 450 according to methods well known in the art. With the exception of copper bonding pad 410 which is not covered, a passivation layer 411 covers the surface of bonding pad and support structure 400.

Reference column 440 in FIG. 4 is for the purpose of illustration only and it shows four levels of metal and their respective vias stacked on top of each other. Reference column 440 is used as a guide for the purpose of illustrating the various layers of metal and vias present in the IC chip containing bonding pad and support structure 400 of the present invention. However, it is manifest that the invention can be practiced in a fabrication process using greater than four interconnect metal layers or fewer than four interconnect metal layers.

Reference column 440 shows top interconnect metal layer 461. The top interconnect metal layer in the present invention is also referred to as "M4." The top interconnect metal layer, i.e. M4, is the same layer in which bonding pad 410 is located. Directly below top interconnect metal layer 461 in reference column 440 is via 462. Via 462 is a via used for connecting top interconnect metal layer (i.e. M4) to the interconnect metal layer directly below which is the third interconnect metal layer (also referred to as "M3" in the present invention). Via 462 is thus also referred to as Via (M4/M3).

The third interconnect metal layer (i.e. M3) is fabricated directly below the top interconnect metal layer. In reference column 440, interconnect metal layer three is referred to by numeral 463. Directly below the third interconnect metal layer 463 in reference column 440 is via 464. Via 464 is a via used for connecting the third interconnect metal layer (i.e. M3) to the interconnect metal layer directly below which is the second interconnect metal layer (also referred to as "M2" in the present invention). Via 464 is thus also referred to as Via (M3/M2).

The second interconnect metal layer (i.e. M2) is fabricated directly below the third interconnect metal layer. In reference column 440, interconnect metal layer two is referred to by numeral 465. Directly below the second interconnect metal layer 465 in reference column 440 is via 466. Via 466 is a via used for connecting the second interconnect metal layer (i.e. M2) to the interconnect metal layer directly below which is the first interconnect metal layer (also referred to as "M1" in the present invention). Via 466 is thus also referred to as Via (M2/M1).

The first interconnect metal layer (i.e. M1) is fabricated directly below the second interconnect metal layer M2. In reference column 440, interconnect metal layer one is referred to by numeral 467. Directly below the first interconnect metal layer 467 in reference column 440 is contact 468. Contact 468 can be used for connecting the first interconnect metal layer (i.e. M1) to the layer directly below M1 which is substrate 450.

Figure 5:
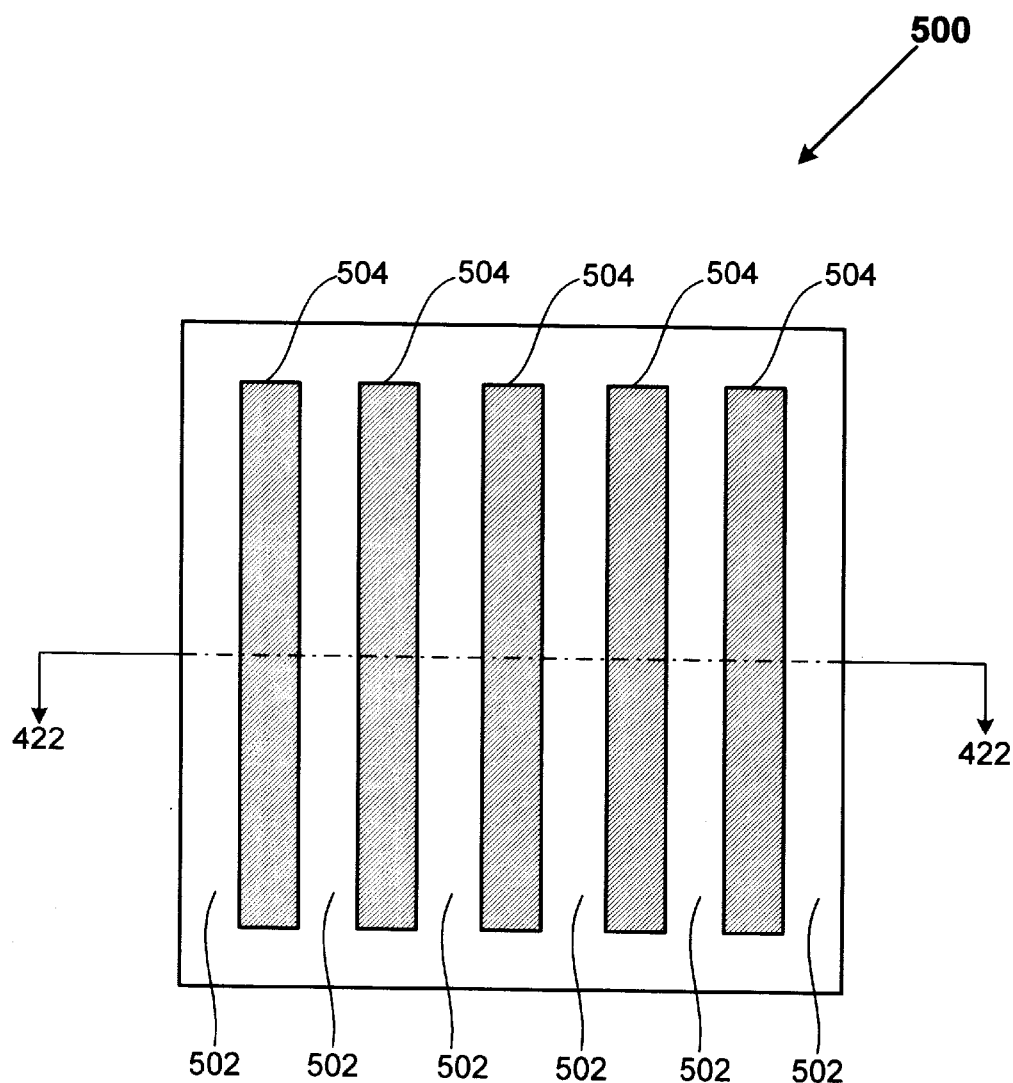
FIG. 5 shows the top view of the alternating interconnect metal segments and dielectric fillers in metal pad structure 422 of FIG. 4.

As shown in the invention's bonding pad and support structure 400 in FIG. 4, metal pad structure 422 is fabricated immediately above silicon dioxide layer 432. Metal pad structure 422 comprises alternating interconnect metal layer one segments and dielectric fillers. The alternating interconnect metal layer one segments and dielectric fillers are marked, respectively, as "M1" and "D" in metal pad structure 422. FIG. 5 shows top view 500 of metal pad structure 422 of the present invention. Metal pad structure 422 shown in FIG. 4 is in effect a cross-section view of top view 500 along dashed line 422 in FIG. 5. The non-hatched areas 502 in FIG. 5 correspond to the interconnect metal layer one segments in structure 422 in FIG. 4 (each segment being marked as "M1"). The hatched areas 504 in FIG. 5 correspond to dielectric fillers marked as "D" in metal pad structure 422 of FIG. 4. It is noted that metal pad structure 422 is fabricated simultaneously with fabrication of interconnect metal layer one.

Referring to FIG. 5, it is apparent that interconnect metal layer one segments 502 are electrically connected to each other since all the non-hatched areas in top view 500 correspond to areas where interconnect metal layer one exists in metal pad structure 422 of FIG. 4. However, the cross-section along the dashed line 422 in FIG. 5 is taken at a point where the interconnect metal segments appear to be unconnected, as they also appear to be unconnected in metal pad structure 422 in FIG. 4. In fact (and as apparent in FIG. 5), interconnect metal layer one segments in structure 422 of FIG. 4 are electrically connected as shown in top view 500 in FIG. 5.

As further shown in the invention's bonding pad and support structure 400 in FIG. 4, via pad structure 420 is fabricated immediately above metal pad structure 422. Via pad structure 420 is essentially a large via having geometry and dimensions that are substantially the same as the geometry and dimensions of bonding pad 410. Via pad structure 420 includes via metal segments connecting the interconnect metal layer two segments in metal pad structure 418 to the interconnect metal layer one segments in metal pad structure 422. Via pad structure 420 in fact comprises alternating segments of via metal and dielectric fillers. However, the alternating segments of via metal and dielectric fillers in via pad structure 420 are not apparent from FIG. 4.

Figure 6:
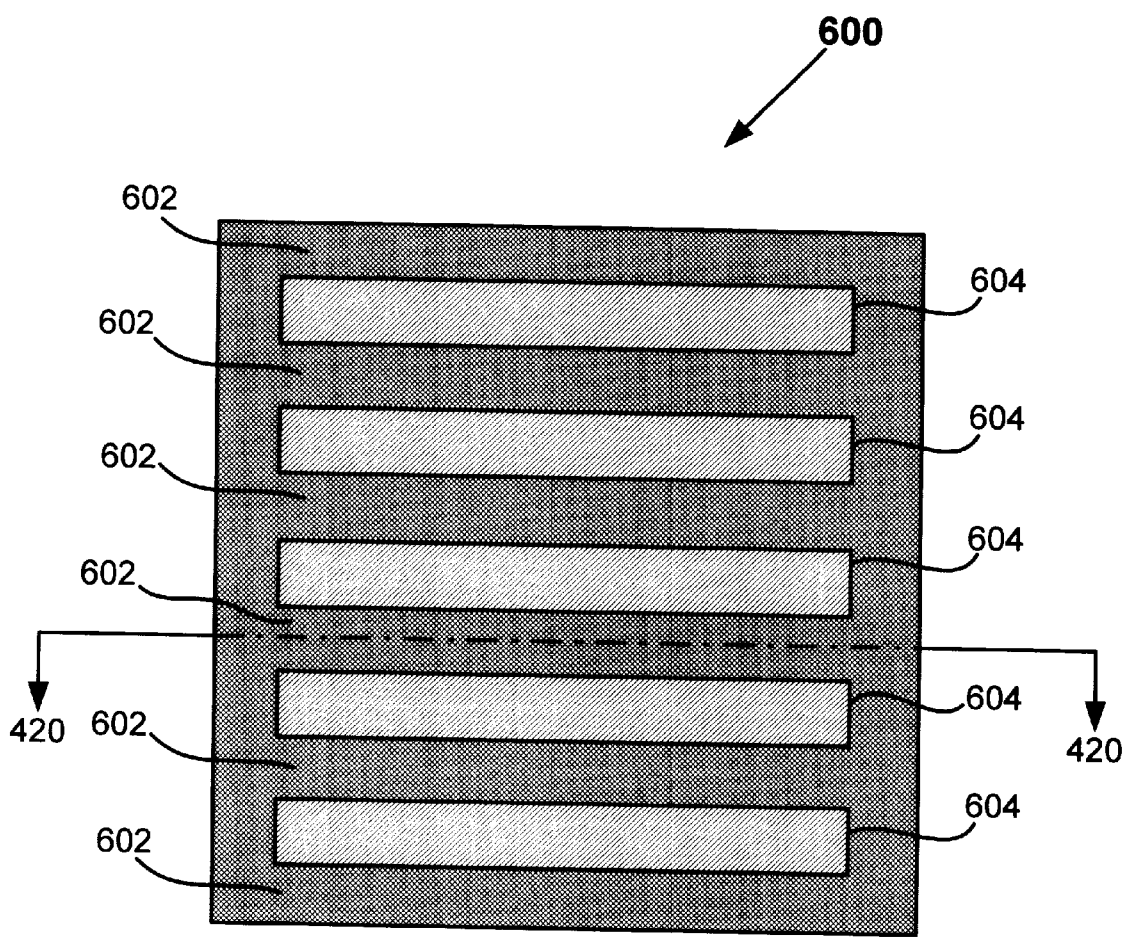
FIG. 6 shows the top view of the alternating via metal segments and dielectric fillers in via pad structure 420 of FIG. 4.

The alternating segments of via metal and dielectric fillers are illustrated in FIG. 6. FIG. 6 shows top view 600 of via pad structure 420 of the present invention. Via pad structure 420 shown in FIG. 4 is in effect a cross-section view of top view 600 along dashed line 420 in FIG. 6. The cross-hatched areas 602 in FIG. 6 correspond to via metal segments in structure 420 in FIG. 4. The hatched areas 604 in FIG. 6 correspond to dielectric fillers. It is noted that via pad structure 420 is fabricated simultaneously with fabrication of vias connecting interconnect metal layer two to interconnect metal layer one.

It is noted that the cross-section 420 in top view 600 in FIG. 6 is taken at a point where there is a via metal segment as opposed to where there is a dielectric filler segment. Accordingly, only a via metal segment is shown in structure 420 in FIG. 4. Moreover, it is apparent from top view 600 in FIG. 6 that via metal segments 602 are electrically connected to each other since all the cross-hatched areas in top view 600 correspond to areas where via metal exists in via pad structure 420 of FIG. 4.

As also shown in the invention's bonding pad and support structure 400 in FIG. 4, metal pad structure 418 is fabricated immediately above via pad structure 420. Metal pad structure 418 has geometry and dimensions that are substantially the same as the geometry and dimensions of bonding pad 410. Metal pad structure 418 in fact comprises alternating segments of interconnect metal layer two and dielectric fillers. However, the alternating segments of interconnect metal layer two and dielectric fillers in metal pad structure 418 are not apparent from FIG. 4.

Figure 7:
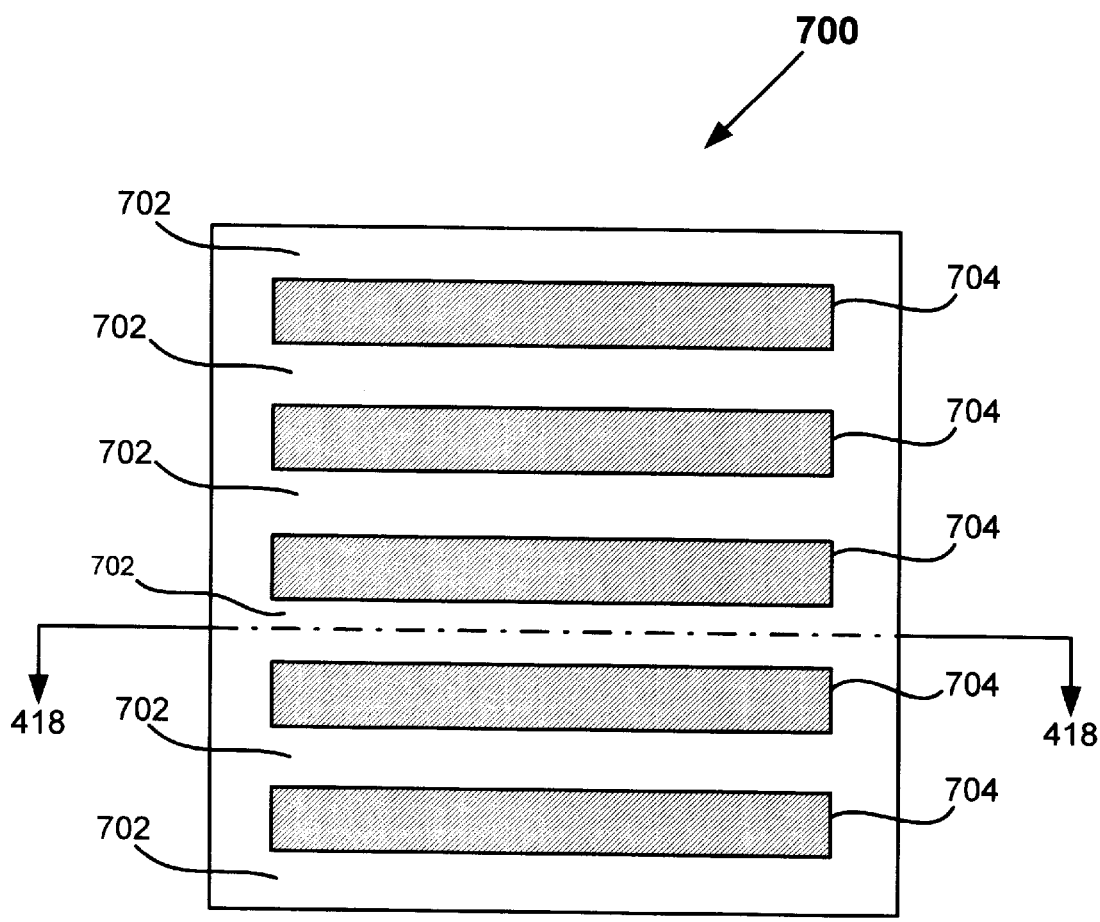
FIG. 7 shows the top view of the alternating interconnect metal segments and dielectric fillers in metal pad structure 418 of FIG. 4.

The alternating segments of interconnect metal layer two and dielectric fillers are illustrated in FIG. 7. FIG. 7 shows top view 700 of metal pad structure 418 of the present invention. Metal pad structure 418 shown in FIG. 4 is in effect a cross-section view of top view 700 along dashed line 418 in FIG. 7. Non-hatched areas 702 in FIG. 7 correspond to interconnect metal layer two segments in structure 418 in FIG. 4. Hatched areas 704 in FIG. 7 correspond to dielectric fillers. It is noted that metal pad structure 418 is fabricated simultaneously with fabrication of interconnect metal layer two.

It is also noted that cross-section 418 in top view 700 in FIG. 7 is taken at a point where there is an interconnect metal layer two segment as opposed to where there is a dielectric filler segment. Accordingly, only an interconnect metal layer two segment shown in structure 418 in FIG. 4. Moreover, it is apparent from top view 700 in FIG. 7 that interconnect metal layer two segments 702 are electrically connected to each other since all the non-hatched areas in top view 700 correspond to areas where interconnect metal layer two exists in metal pad structure 418 of FIG. 4.

It is pointed out that as apparent from top view 700 in FIG. 7 and top view 600 in FIG. 6, in the present embodiment of the invention, the orientation of interconnect metal layer two segments 704 is the same as the orientation of via metal segments 604. In other words, in the present embodiment of the invention, interconnect metal layer two segments 704 are parallel to (and in fact aligned with) via metal segments 604. It is, however, apparent to those skilled in the art that in other embodiments of the invention interconnect metal layer two segments 704 can in fact be perpendicular to via metal segments 604. Indeed, interconnect metal layer two segments 704 can assume any angle of orientation with respect to via metal segments 604 without departing from the scope of the present invention.

Figure 8:
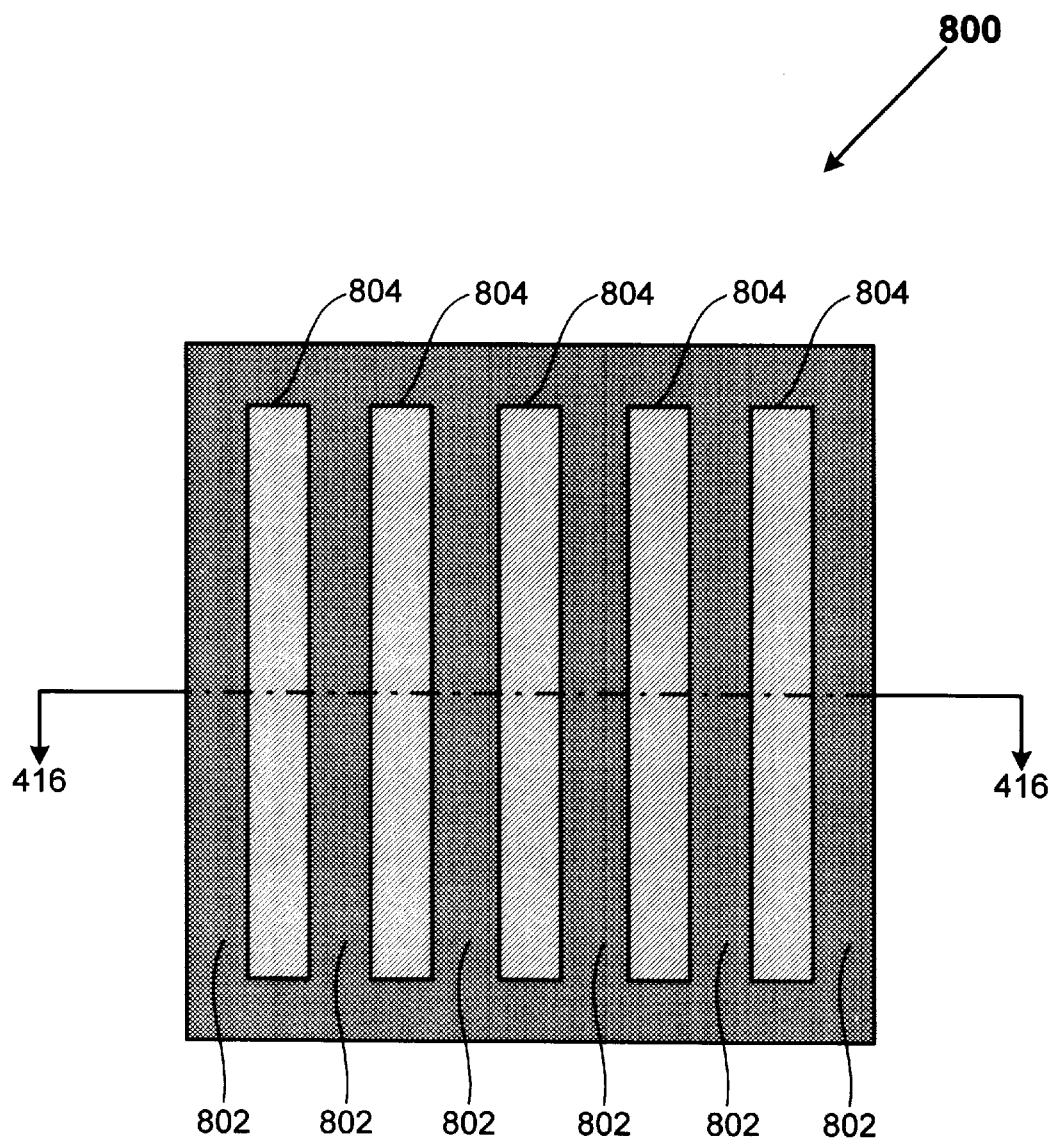
FIG. 8 shows the top view of the alternating via metal segments and dielectric fillers in via pad structure 416 of FIG. 4.

As shown in the invention's bonding pad and support structure 400 in FIG. 4, via pad structure 416 is fabricated immediately above metal pad structure 418. Via pad structure 416 comprises alternating via metal segments and dielectric fillers. The alternating via metal segments and dielectric fillers are marked, respectively, as "V2" and "D" in via pad structure 416. FIG. 8 shows top view 800 of via pad structure 416 of the present invention. Via pad structure 416 shown in FIG. 4 is in effect a cross-section view of top view 800 along dashed line 416 in FIG. 8. The cross-hatched areas 802 in FIG. 8 correspond to the via metal segments in structure 416 in FIG. 4 (each segment being marked as "V2"). The hatched areas 804 in FIG. 8 correspond to dielectric fillers marked as "D" in via pad structure 416 of FIG. 4. It is noted that via pad structure 416 is fabricated simultaneously with fabrication of vias connecting interconnect metal layer three to interconnect metal layer two.

Referring to FIG. 8, it is apparent that via metal segments 802 are electrically connected to each other since all the cross-hatched areas in top view 800 correspond to areas where via metal exists in via pad structure 416 of FIG. 4. However, the cross-section along the dashed line 416 in FIG. 8 is taken at a point where the via metal segments appear to be unconnected, as they also appear to be unconnected in via pad structure 416 in FIG. 4. In fact (and as apparent in FIG. 8), via metal segments in structure 416 of FIG. 4 are electrically connected as shown in top view 800 in FIG. 8.

Figure 9:
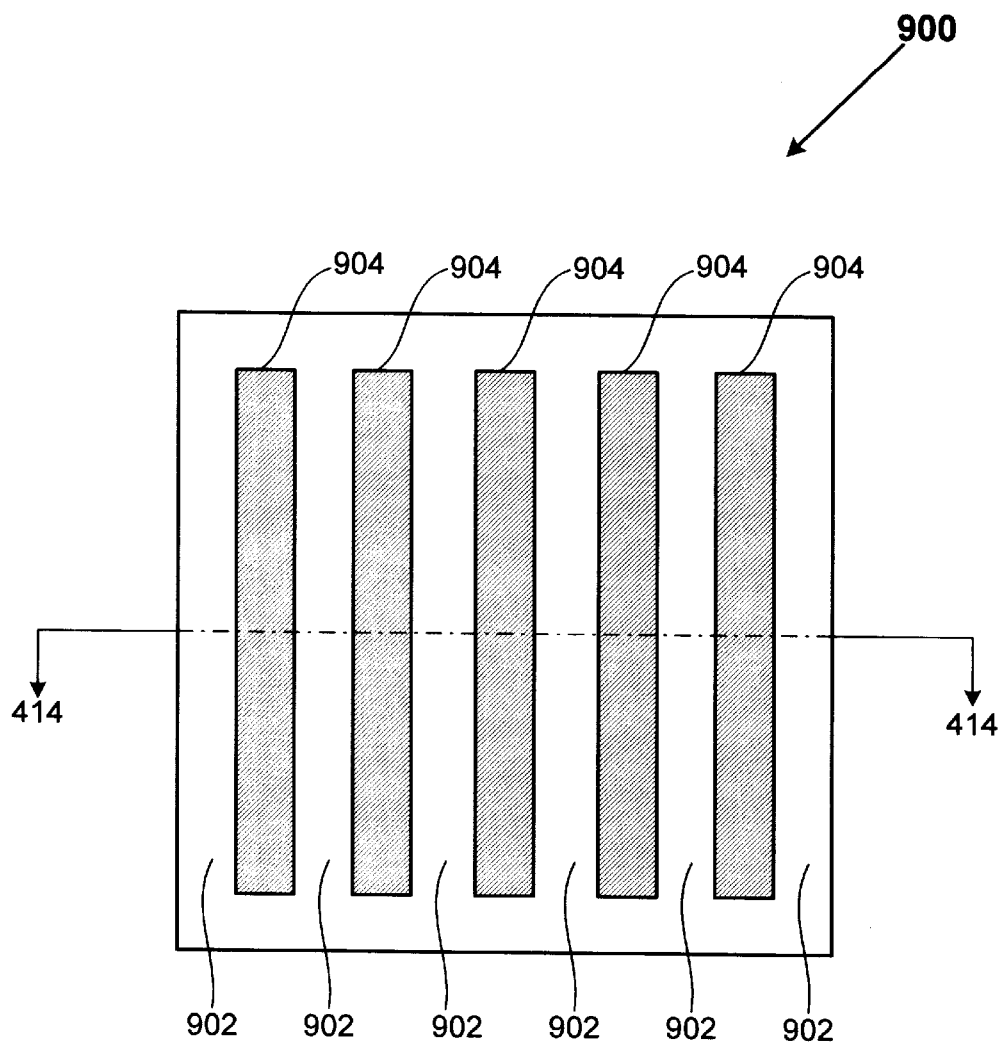
FIG. 9 shows the top view of the alternating interconnect metal segments and dielectric fillers in metal pad structure 414 of FIG. 4.

As shown in the invention's bonding pad and support structure 400 in FIG. 4, metal pad structure 414 is fabricated immediately above via pad structure 416. Metal pad structure 414 comprises alternating interconnect metal layer three segments and dielectric fillers. The alternating interconnect metal layer three segments and dielectric fillers are marked, respectively, as "M3" and "D" in metal pad structure 414. FIG. 9 shows top view 900 of metal pad structure 414 of the present invention. Metal pad structure 414 shown in FIG. 4 is in effect a cross-section view of top view 900 along dashed line 414 in FIG. 9. The non-hatched areas 902 in FIG. 9 correspond to the interconnect metal layer three segments in structure 414 in FIG. 4 (each segment being marked as "M3"). The hatched areas 904 in FIG. 9 correspond to dielectric fillers marked as "D" in metal pad structure 414 of FIG. 4. It is noted that metal pad structure 414 is fabricated simultaneously with fabrication of interconnect metal layer three.

Referring to FIG. 9, it is apparent that interconnect metal layer three segments 902 are electrically connected to each other since all the non-hatched areas in top view 900 correspond to areas where interconnect metal layer three exists in metal pad structure 414 of FIG. 4. However, the cross-section along the dashed line 414 in FIG. 9 is taken at a point where the interconnect metal segments appear to be unconnected, as they also appear to be unconnected in metal pad structure 414 in FIG. 4. In fact (and as apparent in FIG. 9), interconnect metal layer three segments in structure 414 of FIG. 4 are electrically connected as shown in top view 900 in FIG. 9.

It is pointed out that as apparent from top view 900 in FIG. 9 and top view 800 in FIG. 8, in the present embodiment of the invention, the orientation of interconnect metal layer three segments 904 is the same as the orientation of via metal segments 804. In other words, in the present embodiment of the invention, interconnect metal layer three segments 904 are parallel to (and in fact aligned with) via metal segments 804. However, it is apparent to those skilled in the art that in other embodiments of the invention interconnect metal layer three segments 904 may be perpendicular to via metal segments 804. Indeed, interconnect metal layer three segments 904 can assume any angle of orientation with respect to via metal segments 804 without departing from the scope of the present invention.

As further shown in the invention's bonding pad and support structure 400 in FIG. 4, via pad structure 412 is fabricated immediately above metal pad structure 414. Via pad structure 412 is essentially a large via having geometry and dimensions that are substantially the same as the geometry and dimensions of bonding pad 410. Via pad structure 412 consists of only via metal and no dielectric fillers.

Figure 10:
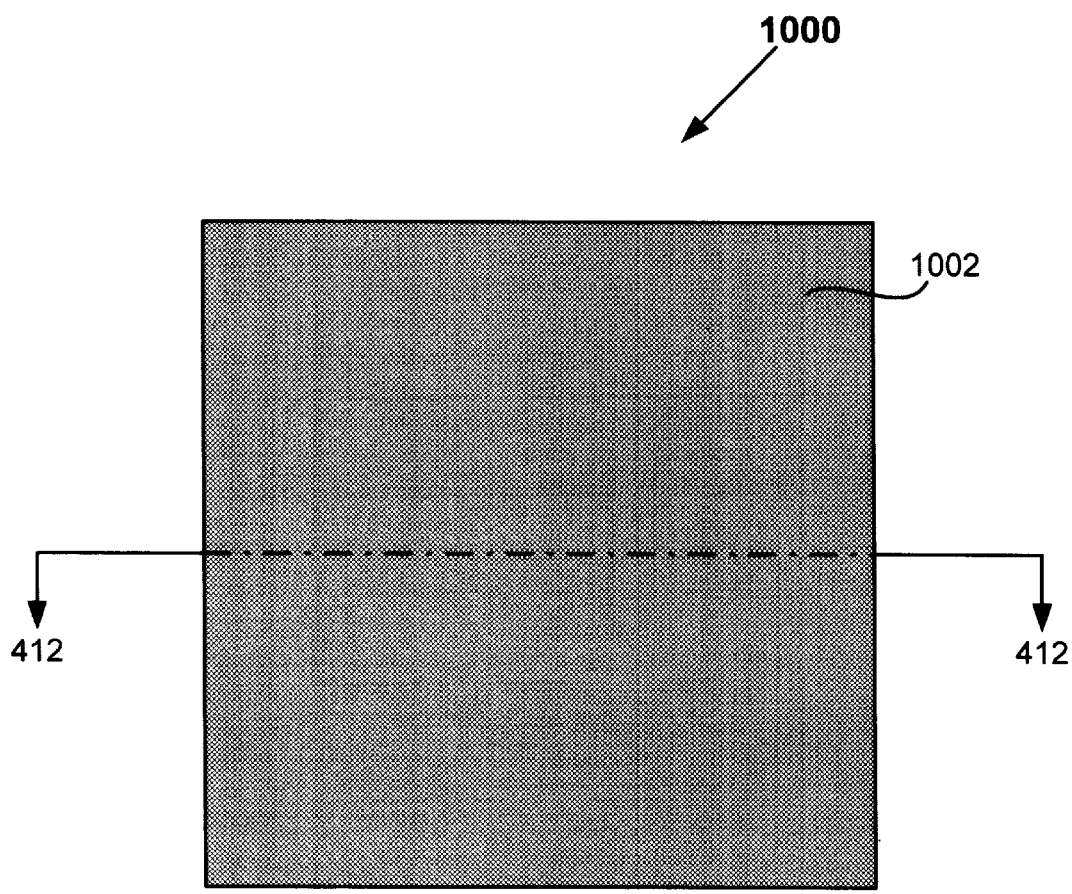
FIG. 10 shows the top view of the via pad structure 412 of FIG. 4.

FIG. 10 shows top view 1000 of via pad structure 412 of the present invention. Via pad structure 412 shown in FIG. 4 is in effect a cross-section view of top view 1000 along dashed line 412 in FIG. 10. The cross-hatched area 1002 in FIG. 10 (which occupies the entire via pad structure) corresponds to via metal in structure 412 in FIG. 4. It is noted that via pad structure 412 is fabricated simultaneously with fabrication of vias connecting interconnect metal layer four to interconnect metal layer three.

As shown in FIG. 4, bonding pad 410 is the topmost structure in bonding pad and support structure 400 of FIG. 4. Bonding pad 410 fabricated immediately above via pad structure 412. Bonding pad 410 typically has a square geometry with dimensions of sixty to one hundred microns on each side. The exact geometry and dimensions of bonding pad 410 can obviously vary without departing from the scope of the present invention. Through via pad structure 412, bonding pad 410 is connected to metal pad structure 414. Bonding pad 410 consists entirely of interconnect metal layer four and no dielectric fillers.

Figure 11:
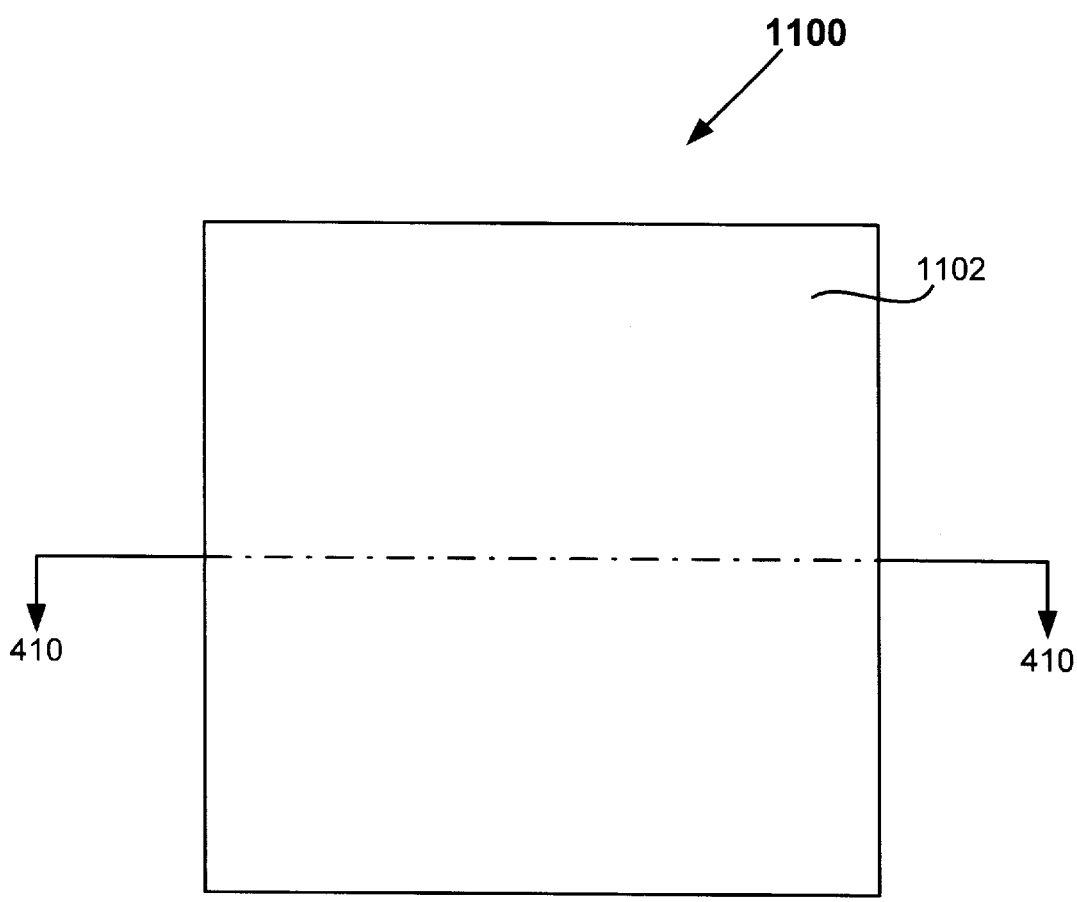
FIG. 11 shows the top view of bonding pad 410 of FIG. 4.

Referring to FIG. 11, top view 1100 for fabricating bonding pad 410 is shown. Bonding pad 410 shown in FIG. 4 is in effect a cross-section view of top view 1100 along dashed line 410 in FIG. 11. The non-hatched area 1102 in FIG. 11 consists of interconnect metal layer four. It is noted that bonding pad 410 is fabricated simultaneously with fabrication of interconnect metal layer four.

In the embodiment of the invention described above, bonding pad and support structure 400 is implemented in an IC chip using copper for interconnect metal layers, copper as via metal as well as a copper bonding pad 410. Thus, in this embodiment, all the various interconnect metal layers one, two, three, and four in bonding pad and support structure 400 are made of copper, or substantially of copper. Moreover, all the dielectric fillers in structures 422, 420, 418, 416, and 414 consist of low-k dielectrics. Examples of low-k dielectrics that can be utilized as dielectric fillers in structures 422, 420, 418, 416, and 414 are: porous silica (with a dielectric constant of 1.2 to 2.3), fluorinated amorphous carbon (with a dielectric constant of 2.0 to 2.6), fluoro-polymer (with a dielectric constant of 1.9 to 2.), parylene (with a dielectric constant of 2.2 to 2.9), polyarylene ether (with a dielectric constant of 2.6 to 2.8), silsesquioxane (with a dielectric constant of 2.5 to 3.0), fluorinated silicon dioxide (with a dielectric constant of 3.2 to 3.6), and diamondlike carbon (with a dielectric constant of 2.4 to 2.8). All of these dielectrics have a dielectric constant below the widely used dielectrics silicon dioxide (having a dielectric constant of approximately 4.0) and silicon nitride (having a dielectric constant of approximately 7.0).

As discussed above, the preferred process for fabricating copper chips is a damascene process accompanied by the CMP process. Due to the CMP process, dishing occurs in bonding pad 410 as shown in FIG. 4. However, it is noted that a via pad structure (i.e. via pad structure 412 in FIG. 4) exists under the entire bonding pad 410. In the preferred embodiment of the invention, via pad structure 412 has substantially the same geometry and dimensions and bonding pad 410. While interconnect metal layer four from which bonding pad 410 is fabricated is typically between 0.2 microns and 1.0 microns thick, the via metal directly below in via pad structure 412 has a typical thickness of between 0.3 and 1.0 microns. Accordingly, via pad structure 412 significantly adds to the effective thickness of bonding pad 410.

Due to the increase in the effective thickness of bonding pad 410, the dishing that occurs in bonding pad 410 as a result of the CMP process is not severe enough to create a hole in bonding pad 410. Accordingly, via pad structure 412 existing under bonding pad 410 is an added assurance that the dishing problem would not be severe enough to require dielectric fillers in bonding pad 410. As such, no dielectric fillers are used in bonding pad 410. The fact that no dielectric fillers are used in bonding pad 410 preserves the adhesiveness of bond wires to bonding pad 410, increases thermal conductivity of bonding pad 410, and results in a stronger electrical connection between bond wires and bonding pad 410.

It is recalled that the CMP process is utilized at each stage of fabrication and patterning of copper interconnect metal layer in a copper IC chip and not merely at the final stage of patterning the top copper interconnect metal layer. In other words, at each layer where interconnect metal or via is patterned, a damascene process is used to lay interconnect metal (i.e. copper) into a trench (or into a trench having dielectric fillers therein). The in-laid copper then undergoes chemical and mechanical polishing as explained above. Thus, without dielectric fillers in the metal pad or via pad structures that are below via pad structure 412, dishing would occur. The dishing in metal pad or via pad structures below via pad structure 412 is harmful to the processing of subsequent layers since, for example, the dishing creates an uneven profile which then has to be properly "covered" by subsequent layers. Accordingly, it is still highly desirable and in fact necessary to prevent dishing in the layers that are below via structure 412.

Therefore, to prevent dishing in layers below via pad structure 412, dielectric fillers should still be used wherever the interconnect metal and via metal is copper. It is observed that in the embodiment of the invention discussed above, all structures below via pad structure 412 and bonding pad 410 do in fact use dielectric fillers. In other words, metal pad structure 414 (alternating interconnect metal layer three segments and dielectric fillers), via pad structure 416 (alternating via metal segments and dielectric fillers), metal pad structure 418 (alternating interconnect metal layer two segments and dielectric fillers), via pad structure 420 (alternating via metal segments and dielectric fillers), and metal pad structure 422 (alternating interconnect metal layer one segments and dielectric fillers) all utilize dielectric fillers. The use of alternating interconnect metal segments and dielectric fillers, or alternating via metal segments and dielectric fillers, in the structures below via pad structure 412 results in prevention of dishing in those structures.

It is recalled the use of dielectric fillers in bonding pad 410 would have caused a severe disadvantage in that the use of dielectric fillers would have reduced the adhesiveness of bond wires to bonding pad 410. However, since adhesion to bond wires is not a requirement for the structures below via pad structure 412, that particular disadvantage of the dielectric fillers, i.e. the causing of a reduction in adhesiveness to bond wires, would not be a factor for structures 414, 416, 418, 420, and 422 which are located below via pad structure 412. Thus, the advantages of dielectric fillers such as the causing of an even profile for the structures below via pad structure 412 outweigh their potential disadvantages since a reduction of adhesion to bond wires is no longer a factor. As such, the present invention utilizes dielectric tillers in structures 414, 416, 418, 420, and 422 which are located below via pad structure 412.

Figure 12:
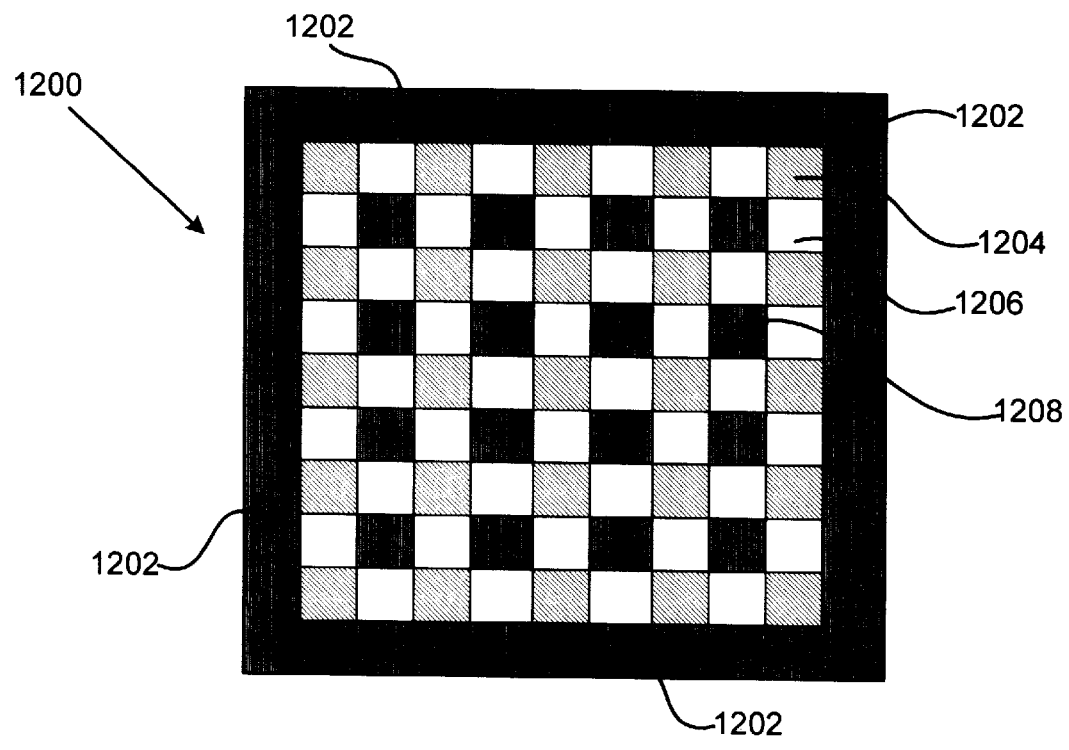
FIG. 12 shows an overlay of the top views of structures 422, 420, 418, 416, and 414 of FIG. 4.
Figure 12:
Figure 12:
Figure 12:

The unique bonding pad and support structure 400 of the present invention overcomes the various disadvantages of the present bonding pads in copper chips. Referring to FIG. 12, an overlay of top views 500, 600, 700, 800, and 900 is shown. It is recalled that top view 500 corresponds to the alternating segments of interconnect metal layer one and dielectric fillers in metal pad structure 422 in FIG. 4, top view 600 corresponds to the alternating via metal segments and dielectric fillers in via pad structure 420 of FIG. 4, top view 700 corresponds to the alternating segments of interconnect metal layer two and dielectric fillers in structure 418 of FIG. 4, top view 800 corresponds to the alternating via metal segments and dielectric fillers in structure 416 of FIG. 4, and top 900 corresponds to the alternating segments of interconnect metal layer three and dielectric fillers in structure 414 of FIG. 4. These top views, i.e. top views 500, 600, 700, 800, and 900 all correspond to the structures located directly below via pad structure 412 and were shown in FIGS. 5, 6, 7, 8, and 9, respectively.

The overlay of these top views (i.e. top views 500, 600, 700, 800, and 900) in FIG. 12 illustrates the composition of various columns in bonding pad and support structure 400 of FIG. 4. As indicated in FIG. 12, the vertical-hatched areas indicate an overlay of areas in metal pad structures and via pad structures which result in a column having metal only. In other words, the vertical-hatched areas indicate columns where only interconnect metal and via metal are present and are connected together in a vertical column of solid metal. Therefore, looking down from via pad structure 412, there is a continuous column of solid metal all around the four sides of via pad structure 412 as shown in FIG. 12. This continuous column of solid metal around the four sides of via pad structure 412 is pointed to by numerals 1202 in FIG. 12. It is apparent from FIG. 4 that the column of solid metal support referred to by numeral 1202 is supported by silicon dioxide layer 432.

Moreover, in this embodiment of the invention, there are sixteen discontinuous columns of solid metal comprised of only interconnect metal and via metal. An example of one of these sixteen discontinuous columns of solid metal is referred to by numeral 1208 in FIG. 12. The columns of solid metal support referred to by numeral 1208 are also supported by silicon dioxide layer 432 (FIG. 4). The remaining columns in FIG. 12 are discontinuous columns having either dielectric fillers only or discontinuous columns comprising dielectric fillers, interconnect metal, and via metal. There are twenty five discontinuous columns having dielectric fillers only. These twenty five discontinuous columns are shown as slanted-hatched areas in FIG. 12. An example of one of these twenty five discontinuous columns is referred to by numeral 1204 in FIG. 12. Also, there are forty discontinuous columns comprising dielectric fillers, interconnect metal, and via metal. These forty discontinuous columns are shown as dotted areas in FIG. 12. An example of one of these forty discontinuous columns is referred to by numeral 1206 in FIG. 12.

Thus, reference to FIG. 12 makes clear that bonding pad 410 has a continuous column of solid metal support around all sides of bonding pad 410 as well as, in this exemplary embodiment, sixteen internal and discontinuous columns of solid metal support. Moreover, there are forty columns, shown as dotted areas 1206 in FIG. 12, where interconnect metal, via metal, and dielectric are laid on top of one another. Thus, areas 1202, 1208, and 1206 in FIG. 12 correspond to columns of solid metal support or columns where there is some support from metal. In other words, with the exception of areas 1204 which consist exclusively of dielectric fillers, the mechanical and thermal support provided for bonding pad 410 is made up either entirely of columns of solid metal or of columns of interconnect metal, via metal, and dielectric. As stated above, in this embodiment of the invention, the phrase "columns of solid metal" refers to columns where there is copper metal interconnect and copper via metal.

Because of the significant solid metal support provided for bonding pad 410 by the continuous column consisting of only copper metal interconnect and copper via metal (i.e.

continuous column 1202 in FIG. 12) as well as the significant solid metal support provided by the discontinuous columns consisting of only copper metal interconnect and copper via metal (i.e. the sixteen discontinuous columns 1208 in FIG. 12), the mechanical and thermal characteristics of bonding pad 410 are significantly improved. Unlike the present copper bonding pad structures, bonding pad and support structure 400 of the present invention has a solid metal support at many locations of thereof.

This solid metal support results in a marked improvement in thermal conductivity of the invention's bonding pad 410. In other words, all the columns of solid metal used under bonding pad 410 are in fact great thermal conductors. In contrast, the prior art bonding pad structures must dissipate heat primarily through layers of low-k dielectrics which have poor thermal conductivity. The invention's bonding pad's improved thermal conductivity results in an improved operation of the semiconductor circuits present in the IC chip.

Another advantage of existence of a number of columns of solid metal support is the improved mechanical support provided for bonding pad 410. As previously stated in this application, low-k dielectric materials have poor mechanical strength and may crack during the bonding process. The prior art bonding pad structures rest primarily on layers of low-k dielectrics which exhibit poor mechanical support. According to the present invention, the addition of a continuous solid metal column all around the four sides of bonding pad 410 along with a number of internal and discontinuous solid metal columns (there are sixteen internally located discontinuous solid metal columns in this embodiment of the invention), result in a significant improvement in the mechanical strength of the invention's bonding pad 410 during the bonding process. The improved mechanical strength of the invention's bonding pad 410 results in an improved yield and reliability of the IC chip.

Another advantage of bonding pad and support structure 400 of the present invention is that the continuous solid metal support referred to by numeral 1202 in FIG. 12 effectively provides a solid wall or a solid metal seal around all sides of bonding pad and support structure 400. The solid metal seal created by continuous solid metal support 1202 prevents any cracks developed in the dielectric below bonding pad 410 to propagate to semiconductor circuits and devices located outside the solid metal seal created by continuous solid metal support 1202. Thus, the semiconductor circuits and devices neighboring bonding pad and support structure 400 are isolated from any cracks that may develop in the dielectric below bonding pad 410 during the bonding process.

It is apparent to those skilled in the art that, in other embodiments of the invention, interconnect metal layer two segments 704 (FIG. 7) can in fact be perpendicular to via metal segments 604 (FIG. 6). Indeed, interconnect metal layer two segments 704 can assume any angle of orientation with respect to via metal segments 604 without departing from the scope of the present invention. Moreover, it is apparent to those skilled in the art that in other embodiments of the invention interconnect metal layer three segments 904 (FIG. 9) may also be perpendicular to via metal segments 804 (FIG. 8). In fact, interconnect metal layer three segments 904 can assume any angle of orientation with respect to via metal segments 804 without departing from the scope of the present invention. Although the orientation of interconnect metal segments in their respective metal pad structures and the orientation of via metal segments in their respective via pad structures can be modified, the present invention is still applicable. The reason is that even when orientation of the interconnect metal segments and via metal segments are modified, the modification can be such that columns of solid metal support under bonding pad 410 still exist.

As was discussed above, the invention's bonding pad 410 is particularly suitable for an IC chip using copper as interconnect metal and via metal and damascene and CMP processes. Because via pad structure 412 is laid out below the entire area of bonding pad 410, the invention's bonding pad 410 has additional support from the solid metal pad constituting via pad structure 412. Because of this additional metal support from via pad structure 412, the invention's bonding pad 410 is more tolerant to dishing. The reason is that the thickness of bonding pad 410 has been effectively increased by the addition of via pad structure 412 under bonding pad 410. Accordingly, there is no possibility that a dielectric layer below bonding pad 410 and via structure 412 would be exposed as a result of the dishing problem during the CMP process. It is important not to expose any dielectric below the bonding pad since it would be difficult or impossible to bond wires to the bonding pad if any dielectric is exposed.

It is noted that the invention's bonding pad and support structure 400 is intended to be implemented in a copper IC chip and as such the fabrication of bonding pad and support structure 400 is compatible with the general processing of a copper IC chip. Accordingly, the fabrication of the invention's bonding pad and support structure 400 does not add any incompatibilities or complications in the processing of the copper 1C chip.

It is further noted that the above detailed description in the present application was directed to a specific embodiment of the present invention. However, the invention's principles are obviously applicable to a number of other embodiments of the present invention.

In an alternative embodiment, bonding pad 410 and via pad structure 412 will also include dielectric fillers. Use of dielectric fillers in bonding pad 410 and in via pad structure 412 would result in a reduction of dishing in bonding pad 410 and in via pad structure 412. When dielectric fillers are used in bonding pad 410, an aluminum layer can be deposited over bonding pad 410 in order to improve adhesion of bond wires to bonding pad 410.

It is noted that in the embodiment of the present invention where no dielectric fillers are used in copper bonding pad 410, the additional steps of depositing and patterning an aluminum layer over the bonding pad are not required since bond wires are attached directly to copper bonding pad 410. Thus, in the embodiment of the invention where no dielectric fillers are used in copper bonding pad 410, the fabrication of bonding pad 410 is simplified since the additional steps associated with depositing and patterning aluminum over bonding pad 410 are saved.

It is also noted that although the present embodiment of the invention was described in relation to a process having four layers of interconnect metal, the invention applies to a process having any number of interconnect metal layers. Specifically, the invention can be applied to a process having only two interconnect metal layers, only three interconnect metal layers, or five or more interconnect metal layers. Moreover, although the embodiment of the present invention described herein uses copper as the interconnect of choice for the bonding pad, the invention can be applied to a process where aluminum or some other metal is used in the bonding pad.

In the embodiment of the invention described above, various layers of interconnect metal, such as interconnect metal layer one, interconnect metal layer two, and interconnect metal layer three were made of copper. However, these layers of interconnect metal may be made of other types of metals, such as aluminum, without departing from the scope of the present invention. For example, each of the interconnect metal layers in metal pad structures 422, 418, and 414 may be made of aluminum instead of copper. In that case, the via metal used in via pad structures 420 and 416 is tungsten (instead of copper). When tungsten is used as the via metal, the dielectric fillers used by the present invention in the via pad structures are still useful and beneficial. By using dielectric fillers in via pad structures using tungsten several advantages are achieved. First, dishing of deposited tungsten is reduced during the chemical mechanical polish ("CMP") used to remove unwanted potions of tungsten film. Second, due to existence of dielectric fillers, a thinner tungsten film can be deposited to fill in the space between dielectric fillers. Third, since the width of tungsten deposited between two dielectric fillers is relatively small, peeling and cracking of the deposited tungsten is reduced. Thus, the present invention's bonding pad and support structure 400 presents several advantages even when the interconnect metal layers are made of aluminum (as opposed to copper) and when the via metal is tungsten (as opposed to copper).

An aspect of the present invention described is the creation of columns having only interconnect metal and via metal to support the bonding pad. Although the specific embodiment described in the present application illustrated a certain configuration of various alternating segments of interconnect metal and dielectric fillers, it is appreciated that the invention generally teaches columns of metal support for the bonding pad that are comprised of only via metal and interconnect metal. The columns are metal support are not limited to the configurations disclosed in the specific embodiments described in the present application. For example, support structures having fewer or greater segments of interconnect metal, via metal, or dielectric fillers can be designed. Moreover, the alternating segments of interconnect metal, via metal, or dielectric fillers can be square, rectangular, circular, triangular, or of any other geometry and/or dimensions without departing from the principles of the present invention.

Finally, the invention was described in relation to a bonding pad. Bonding pads are typically square having dimensions of sixty microns up to one hundred microns on each side. However, the principles of the invention can be applied to any bonding pad of any geometry and any dimension or in fact to any "wide" interconnect layer whether or not used as a bonding pad.

Thus, an improved bonding pad and support structure and method for their fabrication has been disclosed. The invention's bonding pad and support structure overcome the serious need in the art by providing sufficient mechanical support and strength for the bonding pad, good thermal conductivity, strong electrical connection with bond wires, and good adhesion to bond wires while being more tolerant to the potential dishing problem existing in damascene and CMP processing.

What is claimed is:

1. A composite structure comprising:
   a first metal pad structure comprising a first interconnect metal;
   a first via pad structure below said first metal pad structure, said first via pad structure comprising a first via metal, said first via metal contacting said first interconnect metal;
   a second metal pad structure below said first via pad structure, said second metal pad structure comprising a first plurality of segments of a second interconnect metal and a first plurality of dielectric fillers, at least one of said first plurality of segments of said second interconnect metal contacting said first via metal.

2. The composite structure of claim 1 wherein said first metal pad structure is a bonding pad.

3. The composite structure of claim 1 wherein said first metal pad structure has a first geometry, said first geometry having a first plurality of dimensions, said first via pad structure having said first geometry and said first plurality of dimensions.

4. The composite structure of claim 1 wherein each one of said first plurality of dielectric fillers is placed between two of said first plurality of segments of said second interconnect metal.

5. The composite structure of claim 1 wherein said first interconnect metal is selected from the group consisting of copper and aluminum.

6. The composite structure of claim 1 wherein said first via metal is selected from the group consisting of copper and tungsten.

7. The composite structure of claim 1 wherein said second interconnect metal is selected from the group consisting of copper and aluminum.

8. A composite structure comprising:
   a first metal pad structure comprising a first interconnect metal;
   a first via pad structure below said first metal pad structure, said first via pad structure comprising a first via metal, said first via pad structure contacting said first metal pad structure;
   a second metal pad structure below said first via pad structure, said second metal pad structure comprising a first plurality of segments of a second interconnect metal and a first plurality of dielectric fillers, at least one of said first plurality of segments of said second interconnect metal contacting said first via pad structure;
   a second via pad structure below said second metal pad structure, said second via pad structure comprising a first plurality of segments of a second via metal and a second plurality of dielectric fillers, at least one of said first plurality of segments of said second via metal contacting at least one of said first plurality of segments of said second interconnect metal;
   a third metal pad structure below said second via pad structure, said third metal pad structure comprising a first plurality of segments of a third interconnect metal and a third plurality of dielectric fillers, at least one of said first plurality of segments of said third interconnect metal contacting at least one of said first plurality of segments of said second via metal.

9. The composite structure of claim 8 wherein said first metal pad structure is a bonding pad.

10. The composite structure of claim 8 wherein said first metal pad structure has a first geometry, said first geometry having a first plurality of dimensions, said first via pad structure having said first geometry and said first plurality of dimensions.

11. The composite structure of claim 8 wherein each one of said first plurality of dielectric fillers is placed between two of said first plurality of segments of said second interconnect metal.

12. The composite structure of claim 8 wherein each one of said second plurality of dielectric fillers is placed between two of said first plurality of segments of said second via metal.

13. The composite structure of claim 8 wherein each one of said third plurality of dielectric fillers is placed between two of said first plurality of segments of said third interconnect metal.

14. The composite structure of claim 8 wherein said first interconnect metal is selected from the group consisting of copper and aluminum.

15. The composite structure of claim 8 wherein said second interconnect metal is selected from the group consisting of copper and aluminum.

16. The composite structure of claim 8 wherein said third interconnect metal is selected from the group consisting of copper and aluminum.

17. The composite structure of claim 8 wherein said first via metal is selected from the group consisting of copper and tungsten.

18. The composite structure of claim 8 wherein said second via metal is selected from the group consisting of copper and tungsten.

19. A method for fabricating a composite structure in an integrated circuit chip, the method comprising the steps of:
    fabricating a first metal pad structure, said first metal pad structure comprising a first plurality of segments of a first interconnect metal and a first plurality of dielectric fillers;
    fabricating a first via pad structure above said first metal pad structure, said first via pad structure comprising a first via metal, said first via metal contacting at least one of said first plurality of segments of said first interconnect metal;
    fabricating a second metal pad structure above said first via pad structure, said second metal pad structure comprising a second interconnect metal, said second interconnect metal contacting said first via metal.

20. The method of 19 wherein said second metal pad structure is a bonding pad.

21. The method of claim 19 wherein said second metal pad structure has a first geometry, said first geometry having a first plurality of dimensions, said first via pad structure having said first geometry and said first plurality of dimensions.

22. The method of claim 19 wherein each one of said first plurality of dielectric fillers is placed between two of said first plurality of segments of said first interconnect metal.

23. The method of claim 19 wherein said first interconnect metal is selected from the group consisting of copper and aluminum.

24. The method of claim 19 wherein said first via metal is selected from the group consisting of copper and tungsten.

25. The method of claim 19 wherein said second interconnect metal is selected from the group consisting of copper and aluminum.

26. A method for fabricating a composite structure in an integrated circuit chip, the method comprising the steps of:
    fabricating a first metal pad structure, said first metal pad structure comprising a first plurality of segments of a first interconnect metal and a first plurality of dielectric fillers;
    concurrently fabricating a first via pad structure and a second metal pad structure, said first via pad structure being above said first metal pad structure, said first via pad structure comprising a first via metal, said first via metal contacting at least one of said first plurality of segments of said first interconnect metal, said second metal pad structure being above said first via pad structure, said second metal pad structure comprising a second interconnect metal, said second interconnect metal contacting said first via metal.

27. The method of 26 wherein said second metal pad structure is a bonding pad.

28. The method of claim 26 wherein said second metal pad structure has a first geometry, said first geometry having a first plurality of dimensions, said first via pad structure having said first geometry and said first plurality of dimensions.

29. The method of claim 26 wherein each one of said first plurality of dielectric fillers is placed between two of said first plurality of segments of said first interconnect metal.

30. The method of claim 26 wherein said first interconnect metal is selected from the group consisting of copper and aluminum.

31. The method of claim 26 wherein said first via metal is selected from the group consisting of copper, aluminum, and tungsten.

32. The method of claim 26 wherein said second interconnect metal is selected from the group consisting of copper, aluminum, and tungsten.

* * * * *